(12) United States Patent
Yang et al.

(10) Patent No.: US 12,342,696 B2
(45) Date of Patent: Jun. 24, 2025

(54) DISPLAY DEVICE, DISPLAY PANEL AND MANUFACTURING METHOD THEREOF

(71) Applicants: YUNNAN INVENSIGHT OPTOELECTRONICS TECHNOLOGY CO., LTD., Yunnan (CN); BOE TECHNOLOGY GROUP CO., LTD., Beijing (CN)

(72) Inventors: Shengji Yang, Beijing (CN); Xue Dong, Beijing (CN); Hui Wang, Beijing (CN); Xiaochuan Chen, Beijing (CN); Pengcheng Lu, Beijing (CN); Kuanta Huang, Beijing (CN); Dacheng Zhang, Beijing (CN)

(73) Assignees: YANNAN INVENSIGHT OPTOELECTRONICS TECHNOLOGY CO., LTD., Yannan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/915,955

(22) PCT Filed: Aug. 19, 2021

(86) PCT No.: PCT/CN2021/113636
§ 371 (c)(1),
(2) Date: Sep. 29, 2022

(87) PCT Pub. No.: WO2023/019529
PCT Pub. Date: Feb. 23, 2023

(65) Prior Publication Data
US 2024/0224639 A1    Jul. 4, 2024

(51) Int. Cl.
*H10K 59/131*     (2023.01)
*H10K 50/19*      (2023.01)
(Continued)

(52) U.S. Cl.
CPC ....... *H10K 59/131* (2023.02); *H10K 59/1201* (2023.02); *H10K 59/122* (2023.02); *H10K 50/19* (2023.02)

(58) Field of Classification Search
CPC .................................................... H10K 59/124
See application file for complete search history.

(56) References Cited

U.S. PATENT DOCUMENTS 9,449,553 B2 *  9/2016  Kwak ................. G09G 3/3233
9,461,100 B2    10/2016  Sato et al.
(Continued)

FOREIGN PATENT DOCUMENTS

CN     108878472 A     11/2018
CN     110190105 A     8/2019
(Continued)

OTHER PUBLICATIONS

International Search Report from PCT/CN2021/113636 dated May 17, 2022.
Written Opinion from PCT/CN2021/113636 dated May 17, 2022.

*Primary Examiner* — Evren Seven
(74) *Attorney, Agent, or Firm* — Calfee, Halter & Griswold LLP

(57) ABSTRACT

The present disclosure relates to a display device, including: a driving backplane, including a substrate, at least one wiring layer and a planarization layer, wherein the planarization layer is provided with a groove; a first electrode layer, disposed on a surface of the planarization layer away from the substrate, and including a plurality of first electrodes distributed at intervals; a pixel definition layer, disposed on the surface of the planarization layer away from the substrate, wherein a separation groove is formed by the pixel definition layer at the groove; a conductive shielding layer, at least partially disposed in the groove; a light-emitting layer, by which the pixel definition layer, the first electrodes (Continued)

and the conductive shielding layer are covered, wherein the light-emitting layer is recessed at the separation groove and is in direct contact with at least a partial area of the conductive shielding layer.

20 Claims, 26 Drawing Sheets

(51) Int. Cl.
*H10K 59/12* (2023.01)
*H10K 59/122* (2023.01)

(56) References Cited

U.S. PATENT DOCUMENTS

| | | | |
|---|---|---|---|
| 10,916,588 B2* | 2/2021 | Kang | H10K 50/84 |
| 11,018,209 B2 | 5/2021 | Liu et al. | |
| 11,348,985 B2* | 5/2022 | Seon | H10K 59/131 |
| 11,456,437 B2* | 9/2022 | Kim | H10K 50/8426 |
| 2016/0118449 A1 | 4/2016 | Sato et al. | |
| 2019/0326370 A1* | 10/2019 | Lu | H10K 59/1315 |
| 2019/0369788 A1* | 12/2019 | Tada | H10K 59/40 |
| 2020/0295099 A1 | 9/2020 | Liu et al. | |
| 2021/0111374 A1* | 4/2021 | Sung | H10K 77/111 |
| 2021/0273029 A1* | 9/2021 | Bang | H10K 59/131 |
| 2021/0335985 A1 | 10/2021 | Huang | |
| 2021/0384465 A1* | 12/2021 | Park | H10K 59/8791 |
| 2022/0052136 A1 | 2/2022 | Wang et al. | |
| 2022/0115469 A1* | 4/2022 | Huang | H10K 59/122 |
| 2024/0172490 A1* | 5/2024 | Huang | H10K 59/1213 |
| 2024/0215342 A1* | 6/2024 | Huang | H10K 59/124 |

FOREIGN PATENT DOCUMENTS

| | | |
|---|---|---|
| CN | 111463357 A | 7/2020 |
| CN | 111710792 A | 9/2020 |
| CN | 111863929 A | 10/2020 |
| CN | 212342660 U | 1/2021 |
| CN | 212967707 U | 4/2021 |
| CN | 110190105 B | 8/2021 |
| EP | 3622558 A1 | 3/2020 |
| WO | 2018/205511 A1 | 11/2018 |
| WO | 2022/042046 A1 | 3/2022 |

* cited by examiner

DISPLAY DEVICE, DISPLAY PANEL AND MANUFACTURING METHOD THEREOF

CROSS REFERENCE

The present application is the 371 application of PCT Application No. PCT/CN2021/113636, filed Aug. 19, 2021, the entire contents of which are incorporated herein by reference.

TECHNICAL FIELD

The present disclosure relates to the field of display technologies, and in particular, to a display device, a display panel and a manufacturing method for a display panel.

BACKGROUND

With the development of display technologies, display panels have been widely used in various electronic devices such as mobile phones for realizing image display and touch operations. Organic Light-Emitting Diode (OLED) display panels are common display panels.

It should be noted that the information disclosed in the Background section above is only for enhancing the understanding of the background of the present disclosure, and thus may include information that does not constitute prior art known to those of ordinary skill in the art.

SUMMARY

The present disclosure provides a display device, a display panel and a manufacturing method for a display panel.

According to an aspect of the present disclosure, there is provided a display panel, including:
- a driving backplane, including a substrate, at least one wiring layer and a planarization layer, wherein the wiring layer is disposed on a side of the substrate, the wiring layer is covered by the planarization layer, and the planarization layer is provided with a groove;
- a first electrode layer, disposed on a surface of the planarization layer away from the substrate, and including a plurality of first electrodes distributed at intervals, wherein an orthographic projection of the groove on the planarization layer is located outside the first electrodes;
- a pixel definition layer, disposed on the surface of the planarization layer away from the substrate, wherein each first electrode is exposed by the pixel definition layer, and a separation groove is formed by the pixel definition layer at the groove;
- a conductive shielding layer, at least partially disposed in the groove and insulated from the first electrodes;
- a light-emitting layer, by which the pixel definition layer, the first electrodes and the conductive shielding layer are covered, wherein the light-emitting layer is recessed at the separation groove and is in direct contact with at least a partial area of the conductive shielding layer; and
- a second electrode, by which the light-emitting layer is covered.

According to an aspect of the present disclosure, there is provided a manufacturing method for a display panel, including:
- forming a driving backplane, wherein the driving backplane includes a substrate, at least one wiring layer and a planarization layer, the wiring layer is disposed on a side of the substrate, and the wiring layer is covered by the planarization layer;
- opening a groove in the planarization layer;
- forming a first electrode layer on a surface of the planarization layer away from the substrate, wherein the first electrode layer includes a plurality of first electrodes distributed at intervals, and an orthographic projection of the groove on the planarization layer is located outside the first electrodes;
- forming a pixel definition layer on the surface of the planarization layer away from the substrate, wherein each first electrode is exposed by the pixel definition layer, and a separation groove is formed by the pixel definition layer at the groove;
- forming a conductive shielding layer at least in the separation groove;
- forming a light-emitting layer by which the pixel definition layer, the first electrodes and the conductive shielding layer are covered, wherein the light-emitting layer is recessed at the separation groove and is in direct contact with at least a partial area of the conductive shielding layer; and
- forming a second electrode by which the light-emitting layer is covered.

According to an aspect of the present disclosure, there is provided a manufacturing method for a display panel, including:
- forming a driving backplane, wherein the driving backplane includes a substrate, at least one wiring layer and a planarization layer, wherein the wiring layer is disposed on a side of the substrate, and the wiring layer is covered by the planarization layer;
- opening a groove in the planarization layer;
- forming a conductive shielding layer at least in the groove;
- forming a first electrode layer on a surface of the planarization layer away from the substrate, wherein the first electrode layer includes a plurality of first electrodes distributed at intervals, and an orthographic projection of the groove on the planarization layer is located outside the first electrodes;
- forming a pixel definition layer on the surface of the planarization layer away from the substrate, wherein each first electrode and the conductive shielding layer are exposed by the pixel definition layer, and a separation groove is formed by the pixel definition layer at the groove;
- forming a light-emitting layer by which the pixel definition layer, the first electrodes and the conductive shielding layer are covered, wherein the light-emitting layer is recessed at the separation groove and is in direct contact with at least a partial area of the conductive shielding layer; and
- forming a second electrode by which the light-emitting layer is covered.

According to an aspect of the present disclosure, there is provided a display device, including the display panel described in any one of the above embodiments.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

Figure 1:
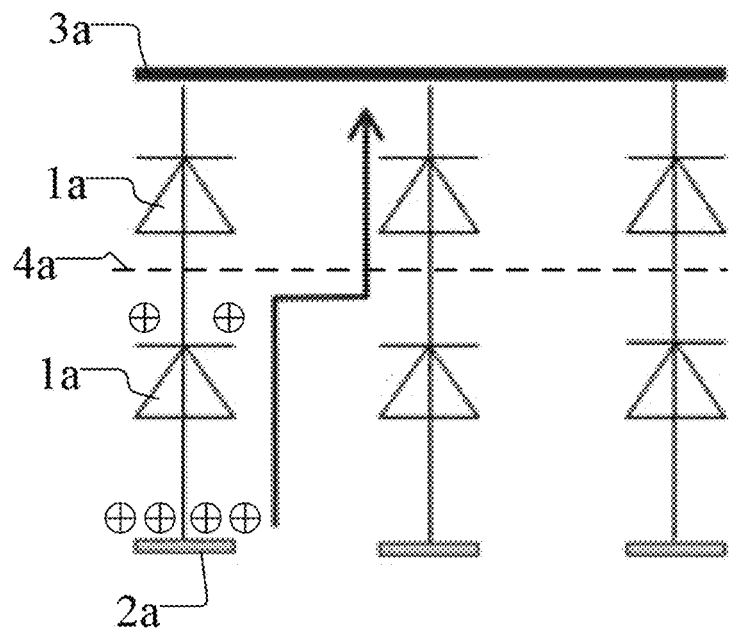
FIG. 1 is a schematic circuit diagram of leakage of a light-emitting unit in the related art.

DESCRIPTION OF REFERENCE SIGNS 1, driving backplane; 110, pixel area; 120, peripheral area; 101, substrate; 1011, well area; 1012, doped area; 102, gate; 103, wiring layer; 1031, first wiring layer; 1031S, source; 1031D, drain; 1032, second wiring layer; 1032a, connection portion; 104, planarization layer; 1041, groove;

2, first electrode layer; 21, first electrode; 201, first layer; 202, second layer; 203, third layer; 204, fourth layer;

3, pixel definition layer; 31, opening; 32, separation groove; 321, groove body; 322, middle area; 323, edge area;

4, conductive shielding layer; 401, first conductive layer; 402, second conductive layer; 403, third conductive layer; 41, shielding ring; 42, connection body; 4011, ridge; 4012, depression;

5, light-emitting layer; 51, light-emitting sub-layer; 52, charge generation layer; 001, light-emitting unit;

6, second electrode; 61, recessed area;

7, color filter layer; 71, filter portion; 72, light-shielding portion;

8, first encapsulation layer; 81, first encapsulation sub-layer; 82, second encapsulation sub-layer; 83, third encapsulation sub-layer;

9. second encapsulation layer;

10. transparent cover plate;

11. light extraction layer;

H1, first via hole; H2, second via hole.

DETAILED DESCRIPTION

Embodiments will now be described more fully with reference to the drawings. However, the embodiments can be implemented in a variety of forms and should not be construed as being limited to examples set forth herein; rather, these embodiments are provided so that the present disclosure will be more full and complete so as to convey the idea of the embodiments to those skilled in this art. The same reference signs in the drawings denote the same or similar structures, and the detailed description thereof will be omitted. In addition, the drawings are merely schematic representations of the present disclosure and are not necessarily drawn to scale.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

In the related art, a Micro Organic Light-Emitting Diode (Micro OLED) display panel is a display panel developed in recent years, and a Micro OLED light-emitting device included in the Micro OLED display panel usually has a size of less than 100 μm. A silicon-based OLED display panel is a common one, and the silicon-based OLED display panel can not only realize active addressing of pixels, but also realize manufacturing of CMOS circuits including pixel circuits, timing control (TCON) circuits, overcurrent protection (OCP) circuits and the like on a silicon substrate through semiconductor manufacturing processes, which are conducive to reducing a system volume and achieving light weight.

Taking the silicon-based OLED display panel as an example, it may include a driving backplane and a light-emitting functional layer, the light-emitting functional layer is disposed on a side of the driving backplane and includes a plurality of light-emitting devices. A light-emitting unit may include one or more serial OLED light-emitting devices. Each light-emitting device includes a first electrode (anode), a light-emitting layer and a second electrode (cathode) stacked in sequence in a direction away from the driving backplane, and by applying electrical signals to the first electrode and the second electrode, the light-emitting layer can be driven to emit light. A specific light-emitting principle of the OLED light-emitting device will not be described in detail here.

In addition, light-emitting layers of respective light-emitting devices can be formed by direct evaporation through a fine mask, and the light-emitting layers of the respective light-emitting devices are distributed at intervals and emit the light independently, realizing color display. However, it is difficult to achieve a high pixel density (PPI) due to limitations of fine mask manufacturing processes. Accordingly, the color display can also be achieved by the cooperation of monochromatic light or white light with a color filter layer, that is, the respective light-emitting devices share the same continuous light-emitting layer. The light-emitting layer can emit the white light or another monochromatic light, the color filter layer has a plurality of filter areas in a one-to-one correspondence with the light-emitting units, one filter area and the corresponding light-emitting unit can constitute one sub-pixel, and a plurality of sub-pixels constitute one pixel. The light transmitted by different filter areas can have different colors, so that different sub-pixels emit the light of different colors. The same pixel includes the plurality of sub-pixels with different colors, for example, one pixel may include three sub-pixels with light emission colors of red (R), green (G), and blue (B), respectively, whereby the color display can be realized by the plurality of pixels.

However, if the light-emitting layer is a continuous whole-layer structure, leakage is likely to occur between a light-emitting unit and surrounding light-emitting units, resulting in cross color. Reasons for the cross color are analyzed below in conjunction with the drawings.

Figure 2:
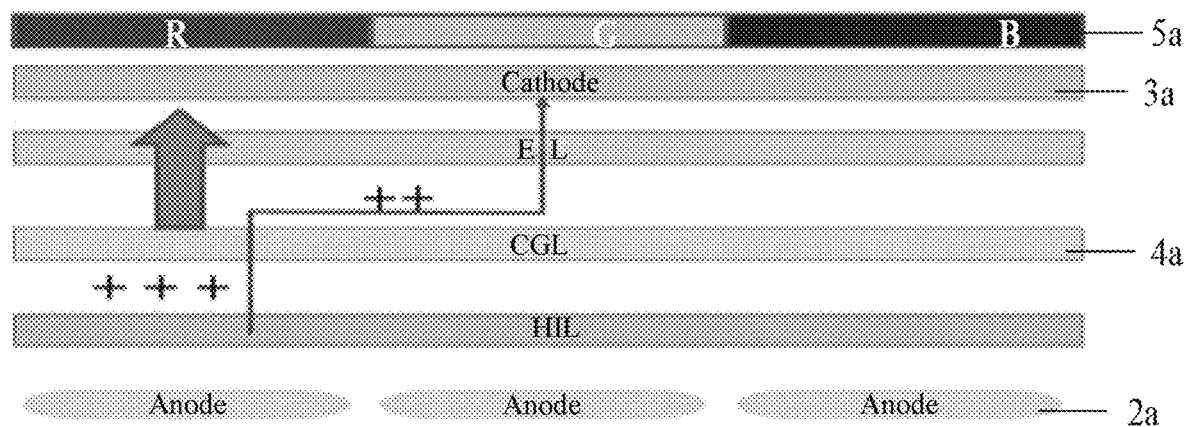
FIG. 2 is a schematic structural diagram of leakage of a light-emitting unit in the related art.

As shown in FIG. 1, each light-emitting unit may include two serial light-emitting devices, the two light-emitting devices share a first electrode 2a and a second electrode 3a, and two light-emitting sub-layers 1a are between the first electrode 2a and the second electrode 3a and are in series to form the light-emitting layer through a charge generation layer 4a. It can be seen from FIGS. 1 and 2 that positive charges (holes) are transferred between two adjacent light-emitting units through the charge generation layer 4a, and as can be seen from FIG. 2, when a light-emitting unit corresponding to a red filter area R in a color filter layer 5a emits the light, a light-emitting unit corresponding to a green filter area G in the color filter layer 5a will also emit the light due to the influence of the leakage, resulting in a decrease in luminous purity of a single pixel and in turn a decrease in color gamut of the entire display panel.

Figure 3:
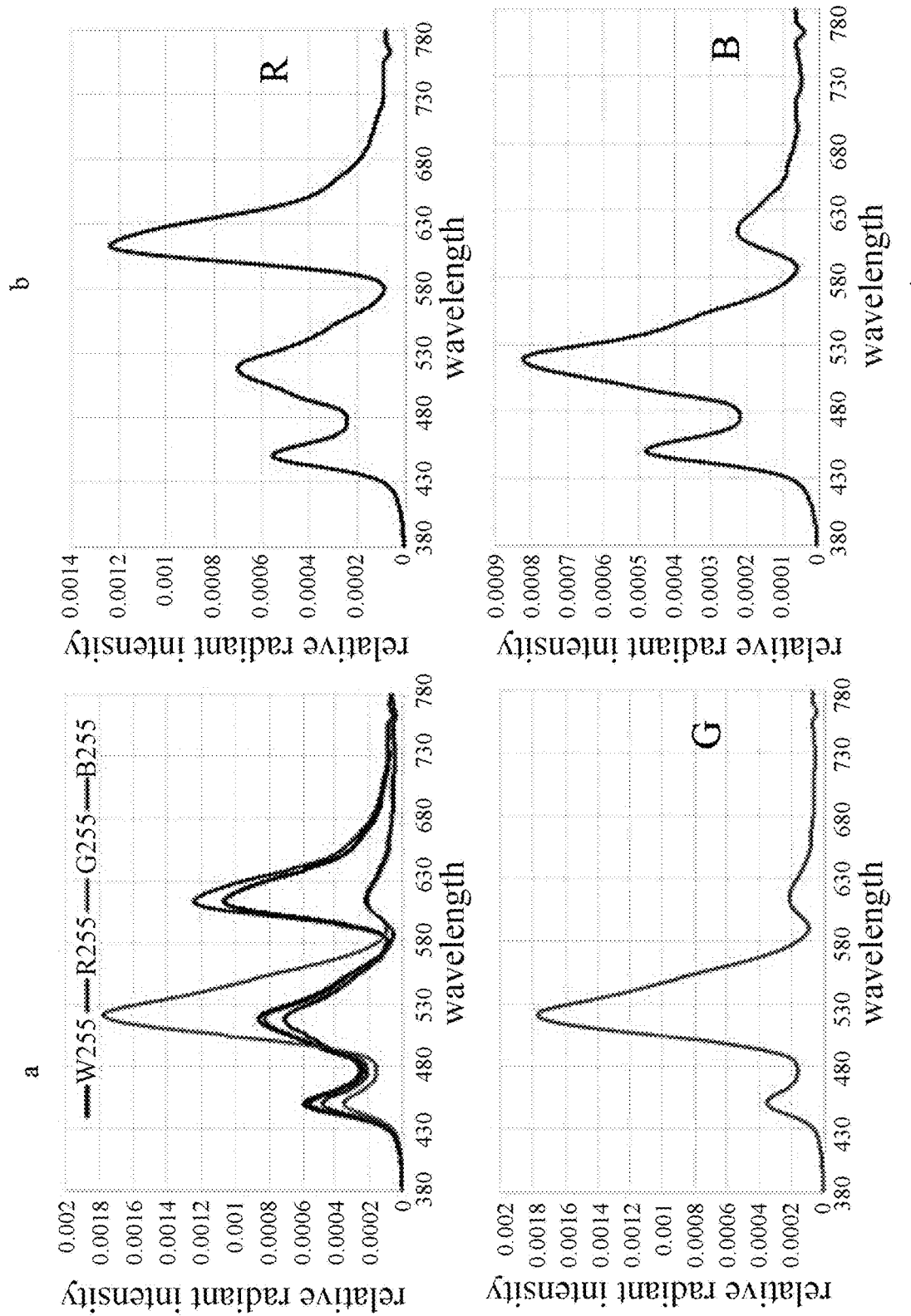
FIG. 3 is a spectrogram of a light-emitting unit in the related art.

As shown in FIG. 3, FIG. 3 shows a spectrogram in which three sub-pixels of red (R), green (G) and blue (B) in the same pixel are lit at the same time (shown in a in FIG. 3) and spectrograms in which three sub-pixels of red (R), green (G) and blue (B) in the same pixel are lit separately (shown in b-c in FIG. 3). According to a wavelength, it can be seen that when the three sub-pixels are lit separately, the light of different colors escapes from adjacent sub-pixels. For example, as shown in FIG. 3, when the R sub-pixel emits red light, there are peaks at wavelengths corresponding to blue light and green light, which are generated by the blue light and the green light. This results in a reduction in the color gamut of the entire display panel. According to measurement and calculation, a color gamut index (NTSC) of the display panel is only 30%.

Embodiments of the present disclosure provide a display panel. As shown in FIGS. 4-8, the display panel may include a driving backplane 1, a first electrode layer 2, a pixel definition layer 3, a conductive shielding layer 4, a light-emitting layer 5, a second electrode 6 and a color filter layer 7.

The driving backplane 1 includes a substrate 101, at least one wiring layer 103 and a planarization layer 104. The wiring layer 103 is disposed on a side of the substrate 101, the planarization layer 104 covers the wiring layer 103, and the planarization layer 104 is provided with a groove 1041.

The first electrode layer 2 is disposed on a surface of the planarization layer 104 away from the substrate 101 and includes a plurality of first electrodes 21 distributed at intervals. An orthographic projection of the groove 1041 on the planarization layer 104 is located outside the first electrodes 21. The pixel definition layer 3 is disposed on the surface of the planarization layer 104 away from the substrate 101 and exposes each first electrode 21, and the pixel definition layer 3 forms a separation groove 32 at the groove 1041. The conductive shielding layer 4 is at least partially disposed in the groove 1041. The light-emitting layer 5 covers the pixel definition layer 3, the first electrode 21 and the conductive shielding layer 4, and the light-emitting layer 5 is recessed at the separation groove 32 and is in direct contact with at least a partial area of the conductive shielding layer 4. The second electrode 6 covers the light-emitting layer 5.

In the display panel of the embodiments of the present disclosure, any first electrode 21 and its corresponding light-emitting layer 5 and second electrode 6 can constitute one light-emitting unit 001. Since the conductive shielding layer 4 is located in the groove 1041 and is insulated from the first electrode 21, and meanwhile, the conductive shielding layer 4 is in direct contact with the light-emitting layer 5, and the orthographic projection of the groove 1041 on the planarization layer 104 is located outside the first electrode 21, so that carriers (such as holes) generated in the light-emitting layer 5 that move along a distribution direction of the first electrodes 21 can be absorbed by the conductive shielding layer 4 to prevent mutual leakage between light-emitting units 001, thereby improving the cross color. In addition, the groove 1041 allow the pixel definition layer 3 to have the separation groove 32, the separation groove 32 can separate individual light-emitting units 001, and the light-emitting layer 5 is recessed at the separation groove 32, which facilitates to thinning or even disconnecting the light-emitting layer 5 at the separation groove 32, and can also prevent the mutual leakage between adjacent light-emitting units 001 and improve the cross color.

A structure for realizing a display function of the display panel of the present disclosure will be described in detail below.

Figure 4:
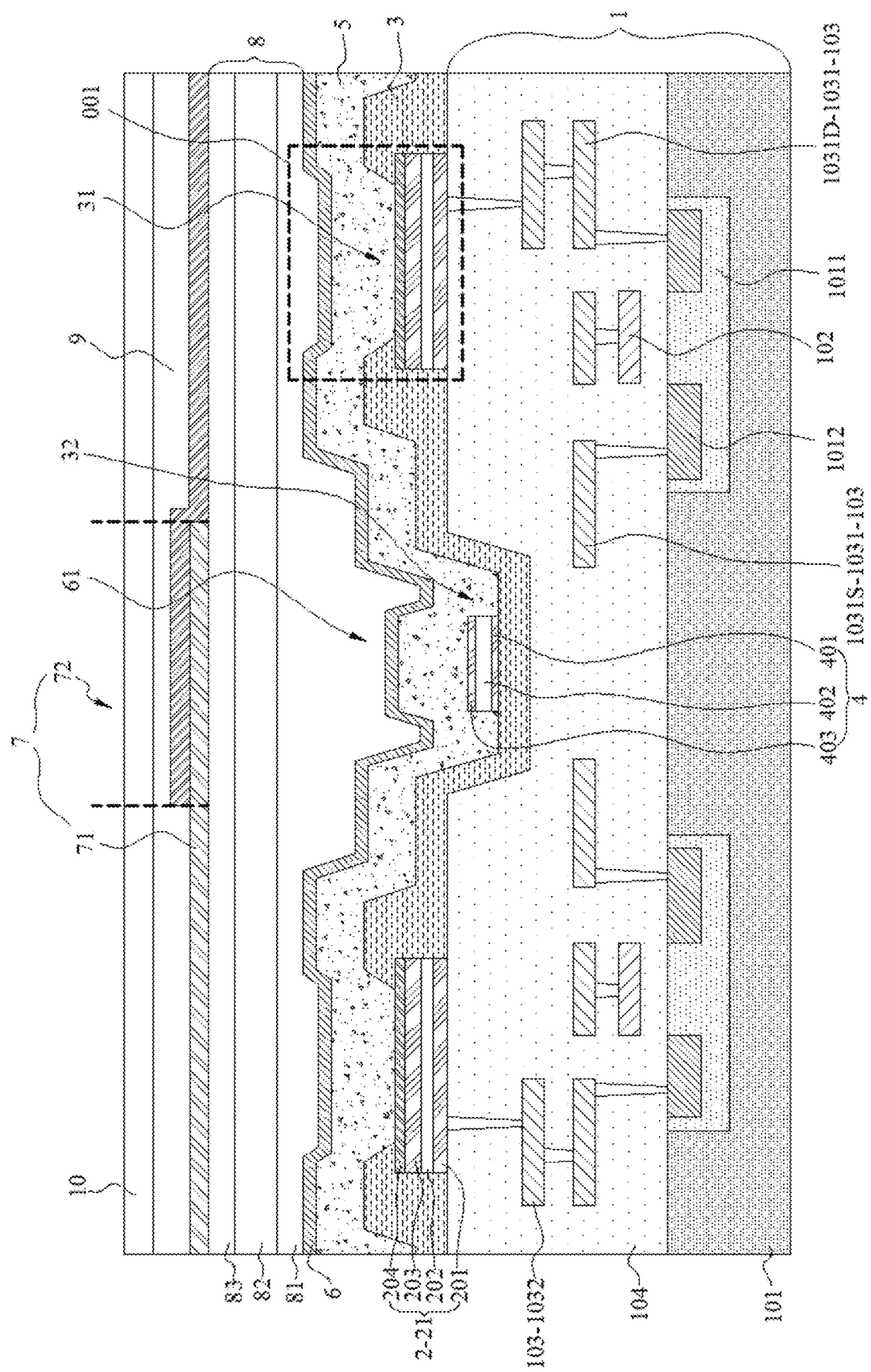
FIG. 4 is a schematic diagram of an embodiment of a display panel of the present disclosure.
Figure 5:
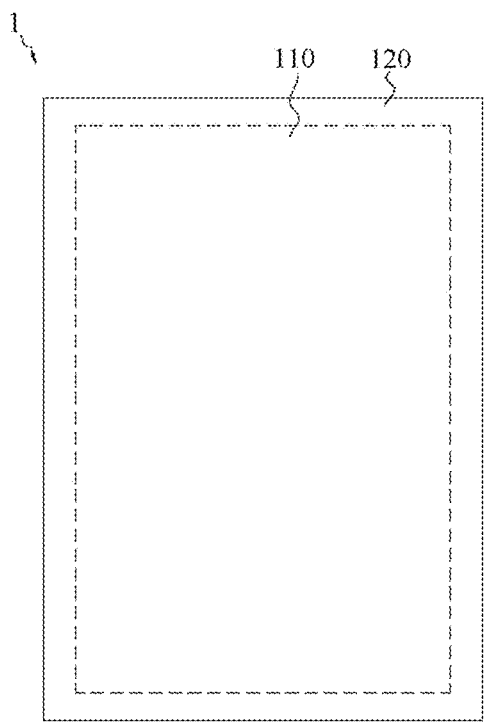
FIG. 5 is a top view of a driving backplane in an embodiment of a display panel of the present disclosure.
Figure 8:
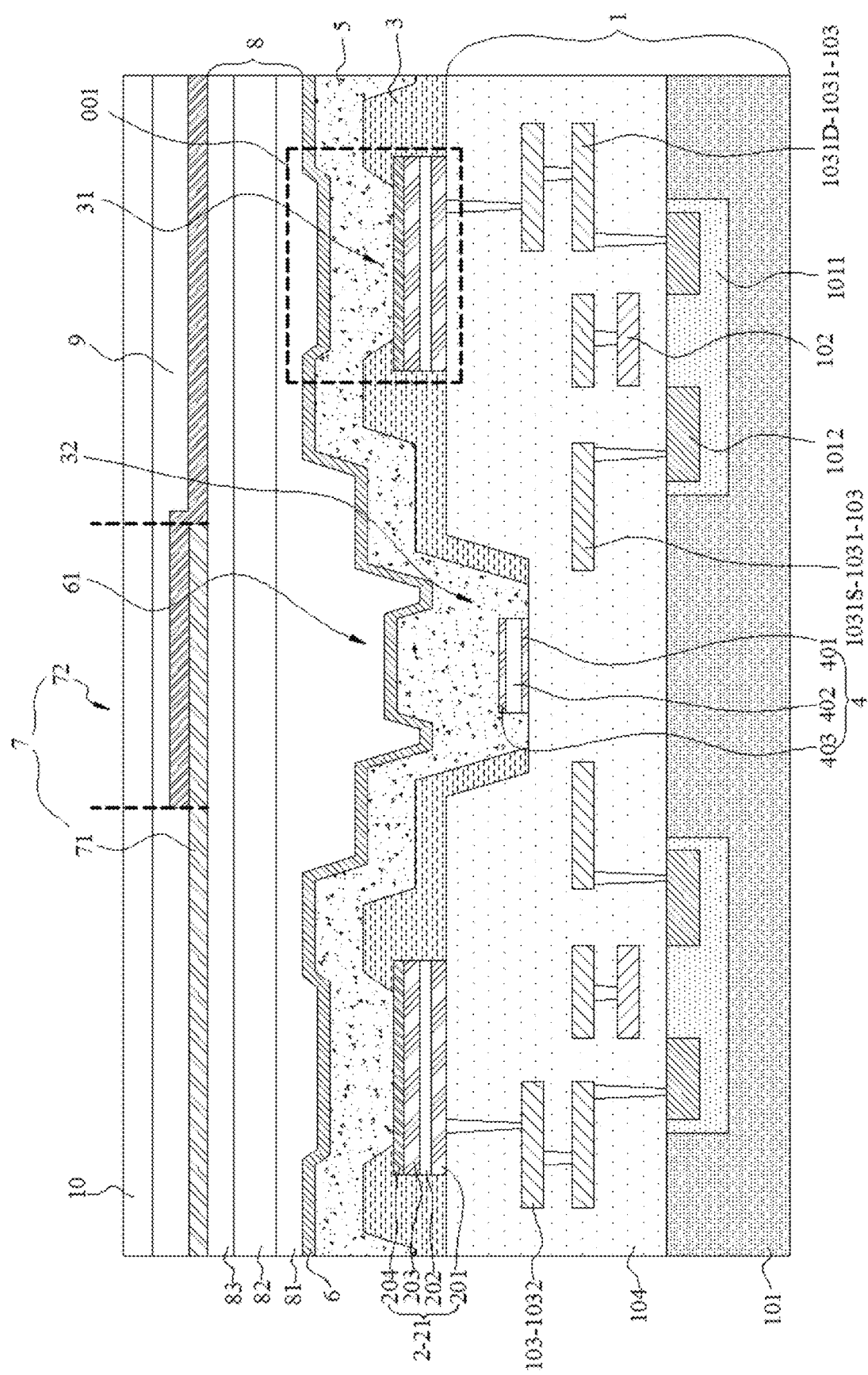
FIG. 8 is a schematic diagram of another embodiment of a display panel of the present disclosure.

As shown in FIGS. 4, 5 and 8, the driving backplane 1 may include a pixel area 110 and a peripheral area 120, the peripheral area 120 is located outside the pixel area 110 and may be disposed around the pixel area 110. The driving backplane 1 is used to form a driving circuit for driving the light-emitting unit 001 to emit the light, and the driving circuit may include a pixel circuit and a peripheral circuit.

There may be a plurality of pixel circuits and a plurality of light-emitting units 001. The pixel circuit is located in the pixel area 110, which may be a pixel circuit such as 2T1C, 4T2C, 6T1C, or 7T1C, as long as it can drive the light-emitting unit 001 to emit the light, and there is no special restriction on a structure of the pixel circuit here. The number of the pixel circuits is the same as the number of the first electrodes 21, and the pixel circuits are coupled to the first electrodes 21 in a one-to-one correspondence, so as to control individual light-emitting units 001 to emit the light, respectively. nTmC represents a pixel circuit includes n transistors (represented by a letter "T") and m capacitors (represented by a letter "C").

The peripheral circuit is located in the peripheral area 120 and is coupled to the pixel circuit. The peripheral circuit may include at least one of a light-emitting control circuit, a gate 102 driving circuit, a source driving circuit, and a power circuit. It should be noted that other circuits may also be included, as long as the peripheral circuit can drive the light-emitting unit 001 to emit the light through the pixel circuit, and meanwhile, the peripheral circuit may further include the power circuit coupled to the second electrode 6 for inputting a power signal to the second electrode 6. The peripheral circuit can input a driving signal to the first electrode 21 and the power signal to the second electrode 6 through the pixel circuit to make the light-emitting unit 001 emit the light.

In some embodiments of the present disclosure, as shown in FIGS. 4 and 8, the driving backplane 1 may include the substrate 101, which may be a silicon substrate, and the above-mentioned driving circuit may be formed on the silicon substrate through a semiconductor process. For example, both the pixel circuit and the peripheral circuit can include a plurality of transistors. A well area 1011 can be formed in the silicon substrate through a doping process, and the well area 1011 has two doped areas 1012 distributed at an interval. Taking one well area 1011 as an example, a gate 102 is disposed on a side of the substrate 101, that is, an orthographic projection of the gate 102 on the substrate 101 is located between the two doped areas 1012. The driving backplane 1 may further include the at least one wiring layer 103 and the planarization layer 104, the wiring layer 103 is disposed on the side of the substrate 101, and the planarization layer 104 covers the wiring layer 103. The at least one wiring layer 103 is coupled to respective doped areas 1012, and includes a source 1031S and a drain 1031D coupled to the two doped areas 1012 in the same well area 1011.

For example, there are two wiring layers 103, and the two wiring layers 103 are located in the planarization layer 104, which, for example, include a first wiring layer 1031 and a second wiring layer 1032. The first wiring layer 1031 is disposed on the side of the substrate 101, and a part of the planarization layer 104 is disposed between the first wiring layer 1031 and the substrate 101. The first wiring layer 1031 includes the source 1031S and the drain 1031D, and the source 1031S and the drain 1031D of the same transistor are coupled to the two doped areas 1012 in the same well area 1011, respectively, so that one transistor can be formed through one well area 1011 and its corresponding gate 102, source 1031S and drain 1031D. The second wiring layer 1032 is disposed on a side of the first wiring layer 1031 away from the substrate 101 and is separated from the first wiring layer 1031 by a part of the planarization layer 104, and at least a partial area of the second wiring layer 1032 is coupled to the first wiring layer 1031. The transistors are coupled through respective wiring layers 103 to form the driving circuit. Specific connection lines and wiring patterns depend on a circuit structure, which are not particularly limited here.

Each wiring layer 103 may be formed by a sputtering process. A material of the planarization layer 104 can be silicon oxide, silicon oxynitride or silicon nitride, and the planarization layer 104 is formed layer by layer through multiple deposition and polishing processes, that is, the planarization layer 104 can be stacked by a plurality of insulating film layers.

As shown in FIGS. 4 and 8, individual light-emitting units 001 of the display panel are distributed in an array on the side of the driving backplane 1, for example, each light-emitting unit 001 is disposed on the surface of the planarization layer 104 away from the substrate 101. Each light-emitting unit 001 may include the first electrode 21, the second electrode 6 and the light-emitting layer 5 located between the first electrode 21 and the second electrode 6. Both the first electrode 21 and the second electrode 6 may be coupled to the wiring layer 103, and through the driving backplane 1, the driving signal is applied to the first electrode 21 and the power signal is applied to the second electrode 6 so as to drive the light-emitting layer 5 to emit the light.

In order to realize the color display, each light-emitting unit 001 can emit the light of the same color, and realize the color display in cooperation with the color filter layer 7 located on a side of the second electrode 6 away from the driving backplane 1. The embodiments of the present disclosure are described by taking this color display scheme as an example. It should be noted that each light-emitting unit 001 can also emit the light independently, and different light-emitting units 001 can emit the light of different colors.

Figure 6:
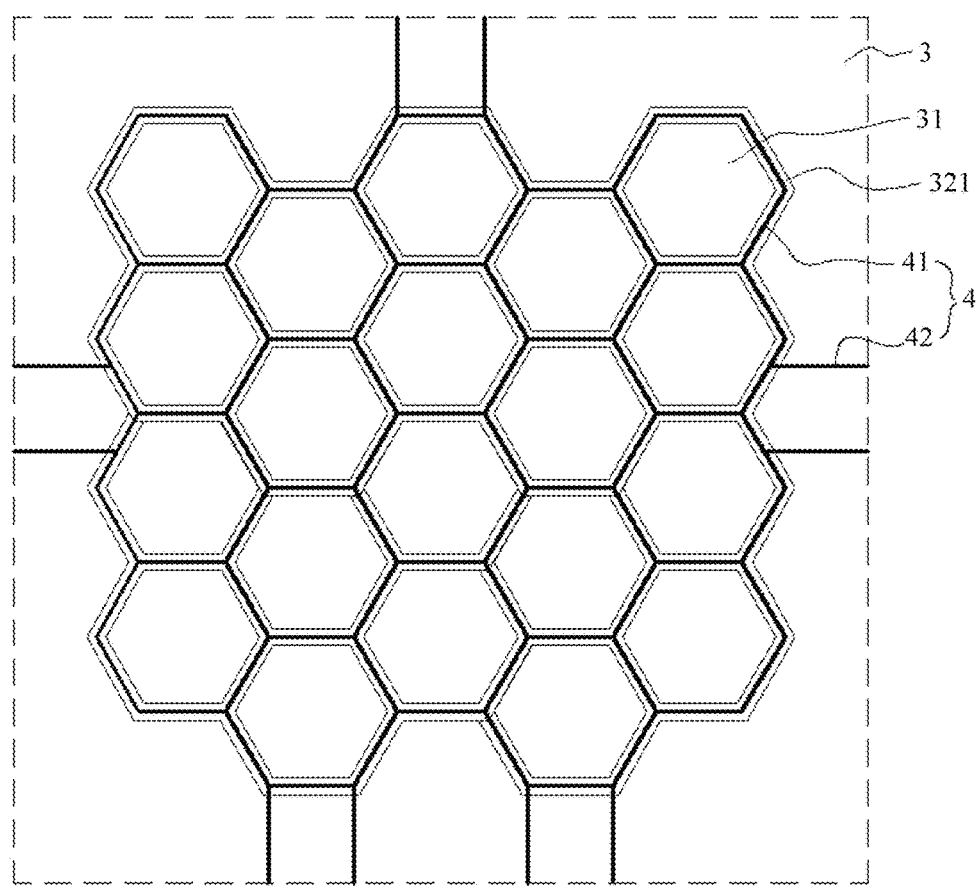
FIG. 6 is a top view of a pixel definition layer and a conductive shielding layer in an embodiment of a display panel of the present disclosure.

In some embodiments of the present disclosure, as shown in FIGS. 4 and 6, a plurality of light-emitting units 001 may be formed by the first electrode layer 2, the pixel definition layer 3, the light-emitting layer 5 and the second electrode 6.

The first electrode layer 2 is disposed on the side of the driving backplane 1, for example, the first electrode layer 2 is disposed on the surface of the planarization layer 104 away from the substrate 101. The first electrode layer 2 may include the plurality of first electrodes 21 distributed at intervals, and an orthographic projection of each first electrode 21 on the driving backplane 1 is located in the pixel area 110 and each first electrode 21 is coupled to the pixel circuit. One first electrode 21 is coupled to one pixel circuit, for example, the first electrode 21 can be coupled to the second wiring layer 1032.

The first electrode layer 2 may have a single-layer or multi-layer structure, and its material is not particularly limited herein. For example, the first electrode layer 2 may include a first layer 201, a second layer 202, a third layer 203 and a fourth layer 204 sequentially stacked in a direction away from the driving backplane 1. The first layer 201 and the third layer 203 can use the same metal material, such as titanium, the fourth layer 204 can use a transparent conductive material such as Indium Tin Oxide (ITO), and the second layer 202 can use a metal material different from those of the first layer 201, the third layer 203 and the fourth layer 204, and a resistivity of the second layer 202 is lower than those of the first layer 201 and the third layer 203, for example, a material of the second layer 202 can be aluminum.

As shown in FIGS. 4 and 6, the pixel definition layer 3 and the first electrode layer 2 are disposed on the same surface of the driving backplane 1, that is, the surface of the planarization layer 104 away from the substrate 101, and the pixel definition layer 3 exposes each first electrode 21. Specifically, the pixel definition layer 3 is provided with an opening 31 exposing the first electrode 21, and a range of each light-emitting unit 001 can be defined by the pixel definition layer 3 and the opening 31. A material of the pixel definition layer 3 may be an insulating material such as silicon oxide and silicon nitride, which is not particularly limited herein.

An orthographic projection of any opening 31 on the driving backplane 1 is located within the first electrode 21 exposed by the opening 31, that is, the opening 31 is not larger than the first electrode 21 exposed by it. As shown in FIG. 6, a shape of the opening 31 can be a polygon such as a rectangle, a pentagon, and a hexagon, but not necessarily a regular polygon. The shape of the opening 31 can also be other shapes such as an ellipse, which is not specially limited herein.

Figure 7:
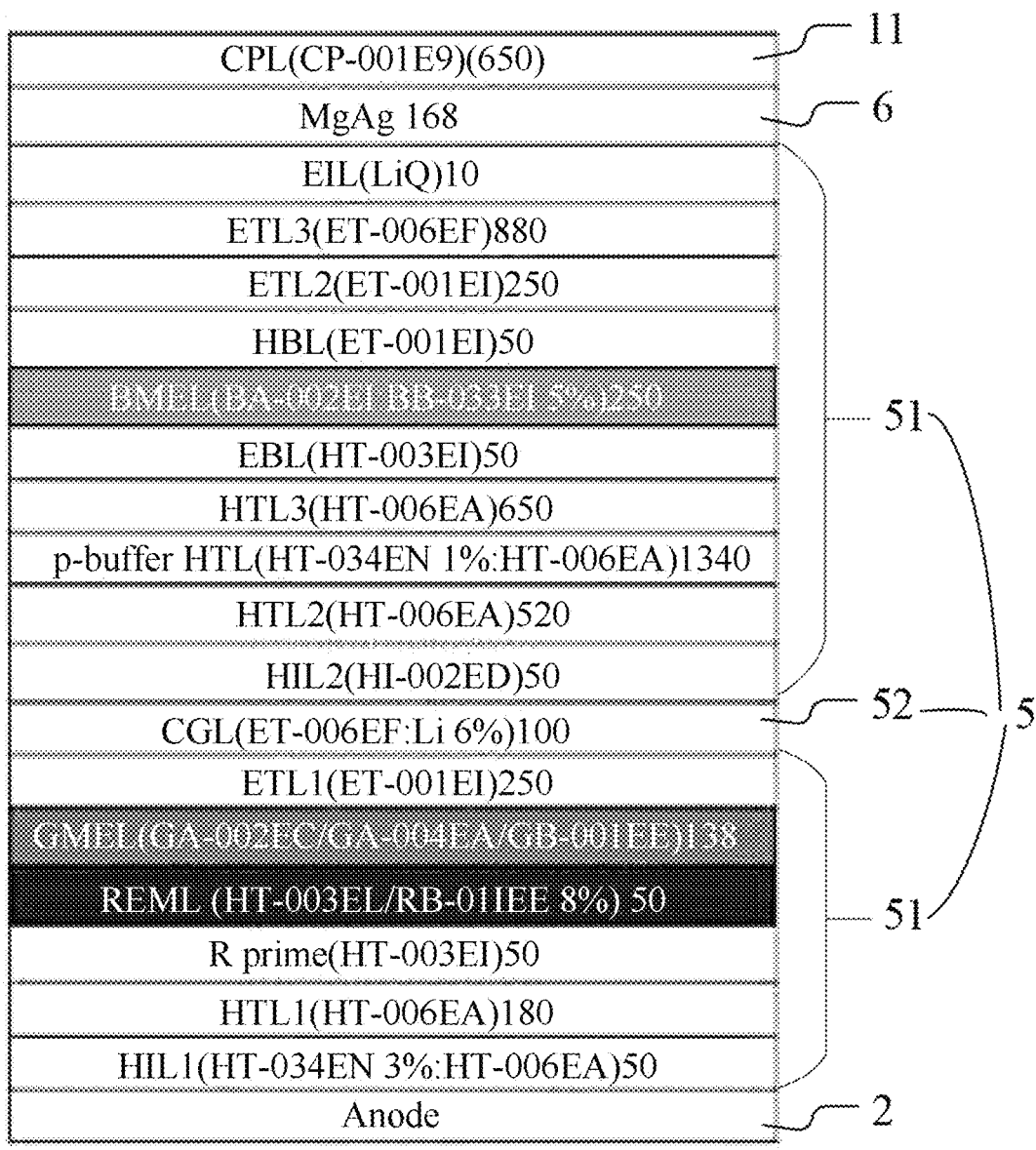
FIG. 7 is a schematic diagram of a light-emitting layer in an embodiment of a display panel of the present disclosure.

As shown in FIGS. 4 and 7, the light-emitting layer 5 covers the pixel definition layer 3 and the first electrode 21. The light-emitting layer 5 is located in the opening 31 and an area of the light-emitting layer 5 overlapping with the first electrode layer 2 is used to form the light-emitting unit 001, that is, the respective light-emitting units 001 may share the same light-emitting layer 5, that is, portions of the light-emitting layer 5 located in different openings 31 belong to different light-emitting units 001. In addition, since the respective light-emitting units 001 share the light-emitting layer 5, different light-emitting units 001 emit the light of the same color.

In some embodiments of the present disclosure, as shown in FIG. 7, the light-emitting unit 001 may include a plurality of light-emitting devices, each of which includes the first electrode 21, the second electrode 6 and a plurality of light-emitting sub-layers 51 between the first electrode 21 and the second electrode 6. Individual light-emitting devices of the same light-emitting unit 001 may share the same first electrode 21 and the same second electrode 6, that is, the same light-emitting unit 001 may have only one first electrode 21 and one second electrode 6.

For example, as shown in FIG. 7, the light-emitting layer 5 may include the plurality of light-emitting sub-layers 51 sequentially in series along the direction away from the driving backplane 1, and at least one light-emitting sub-layer 51 is in series with an adjacent light-emitting sub-layer 51 through a charge generation layer 52. When electrical signals are applied to the first electrode 21 and the second electrode 6, each light-emitting sub-layer 51 can emit the light, and different light-emitting sub-layers 51 can be used to emit the light of different colors.

Further, as shown in FIG. 7, any light-emitting sub-layer 51 may include a hole injection layer (HIL), a hole transport layer (HTL), a light-emitting material layer (EL), an electron transport layer (ETL) and an electron injection layer (EIL) distributed along the direction away from the driving backplane 1, and a specific light-emitting principle will not be described in detail here. The number of the hole injection layers, the number of the hole transport layers, the number of the electron transport layers and the number of the electron injection layers are not specially limited here, and individual light-emitting sub-layers 51 may share one or more of the hole injection layer, the hole transport layer, the electron transport layer, and the electron injection layer. In addition, the charge generation layer 52 may be disposed between at least two adjacent light-emitting sub-layers 51, so that the two light-emitting sub-layers 51 are in series.

In some embodiments of the present disclosure, as shown in FIG. 7, the light-emitting layer 5 may include three light-emitting sub-layers 51 with different colors, namely, a first light-emitting sub-layer 51 that emits the red light, a second light-emitting sub-layer 51 that emits the green light, and a third light-emitting sub-layer 51 that emits the blue light. When the first light-emitting sub-layer 51, the second light-emitting sub-layer 51 and the third light-emitting sub-layer 51 emit the light simultaneously, the light-emitting layer 5 can emit the white light. The first light-emitting sub-layer 51 and the second light-emitting sub-layer 51 share the hole injection layer, the hole transport layer, the electron transport layer and the electron injection layer, and a light-emitting material layer of the second light-emitting sub-layer 51 is disposed an a surface of a light-emitting material layer of the first light-emitting sub-layer 51 away from the driving backplane 1, so that the first light-emitting sub-layer 51 and the second light-emitting sub-layer 51 are directly in series. A surface of the second light-emitting sub-layer 51 away from the driving backplane 1 may be provided with the charge generation layer 52. The third light-emitting sub-layer 51 shares the electron injection layer with the first light-emitting sub-layer 51 and the second light-emitting sub-layer 51, and a hole injection layer of the third light-emitting sub-layer 51 is disposed on a surface of the charge generation layer 52 away from the driving backplane 1, so that the third light-emitting sub-layer 51 and the second light-emitting sub-layer 51 can be in series.

As shown in FIGS. 4 and 8, the second electrode 6 covers the light-emitting layer 5, and an orthographic projection of the second electrode 6 on the driving backplane 1 can cover the pixel area 110 and extend into the peripheral area 120. Individual light-emitting unit 001 may share the same second electrode 6. When a voltage difference between the second electrode 6 and the first electrode 21 reaches a voltage difference that enables the light-emitting layer 5 to emit the light, the light-emitting layer 5 can emit the light. The light-emitting layer 5 can be controlled to emit the light by controlling voltages of the power signal input to the second electrode 6 and the driving signal input to the first electrode 21.

As shown in FIGS. 4 and 8, the color filter layer 7 is disposed on the side of the second electrode 6 away from the driving backplane 1, and includes a plurality of filter portions 71. Respective first electrodes 21 are disposed opposite to respective filter portions 71 in a direction perpendicular to the substrate 101 in a one-to-one correspondence, that is, an orthographic projection of one filter portion 71 on the planarization layer 104 at least partially overlaps with one first electrode 21. The filter portions 71 at least include three color filter portions 71, for example, a filter portion 71 that can transmit the red light, a filter portion 71 that can transmit the green light, and a filter portion 71 that can transmit the blue light. After the light emitted by the respective light-emitting units 001 is filtered by the filter portions 71, monochromatic light of different colors can be obtained, thereby realizing the color display. One filter portion 71 and its corresponding light-emitting unit 001 can constitute one sub-pixel, the color of the light emitted by any sub-pixel is the color of the light transmitted by the filter portion 71. A plurality of sub-pixels can constitute one pixel, and individual sub-pixels of the same pixel emit the light of different colors.

A shape of an orthographic projection of the filter portion 71 on the planarization layer 104 may be the same as the shape of the opening 31 of the pixel definition layer 3, and orthographic projections of respective openings 31 on the planarization layer 104 are located within orthographic projections of respective filter portions 71 on the planarization layer 104 in a one-to-one correspondence.

As shown in FIGS. 4 and 8, the color filter layer 7 may further include a light-shielding portion 72 separating the filter portions 71, which is opaque and blocks an area between two light-emitting units 001. The filter portion 71 may be disposed to be spaced apart the filter portion 71 by directly adopting a light-shielding material. Alternatively, in some embodiments of the present disclosure, adjacent filter portions 71 are stacked in an area between two adjacent light-emitting units 001, and colors of the light transmitted by the two filter portions 71 are different, so that the stacked area cannot transmit the light.

In addition, in some embodiments of the present disclosure, on the basis that the light-emitting layer 5 emits the white light, in order to improve picture brightness, the color filter layer 7 may further include a transparent portion, and one transparent portion may be disposed opposite to one light-emitting unit 001 in the direction perpendicular to the substrate 101, so that the color filter layer 7 can also transmit the white light, and the brightness can be increased through the white light.

In order to improve light extraction efficiency, the side of the second electrode 6 away from the driving backplane 1 can be covered by a light extraction layer 11, to improve the brightness. Further, the light extraction layer 11 can directly cover a surface of the second electrode 6 away from the driving backplane 1.

In order to facilitate the coupling of the second electrode 6 with the driving circuit, in some embodiments of the present disclosure, the first electrode layer 2 further includes an interconnection ring, an orthographic projection of the interconnection ring on the driving backplane 1 is located in the peripheral area 120, and the interconnection ring can be coupled to the peripheral circuit and surrounds outside the pixel area 110. The second electrode 6 can be coupled with the interconnection ring, so that the second electrode 6 can be coupled with the peripheral circuit through the interconnection ring, and the driving signal can be applied to the second electrode 6 by the peripheral circuit. A pattern of the interconnection ring may be the same as a pattern of the first electrode 21 in the pixel area 110, so as to improve uniformity of the pattern of the first electrode layer 2.

As shown in FIGS. 4 and 8, in some embodiments of the present disclosure, the display panel of the present disclosure may further include a first encapsulation layer 8, which may be disposed on the side of the second electrode 6 away from the driving backplane 1 and may be located between the color filter layer 7 and the second electrode 6, and the first encapsulation layer 8 is used to block erosion of external water and oxygen. The first encapsulation layer 8 may be a single-layer or multi-layer structure. For example, the first encapsulation layer 8 may include a first encapsulation sub-layer 81, a second encapsulation sub-layer 82 and a third encapsulation sub-layer 81 sequentially stacked in the direction away from the driving backplane 1, materials of the first encapsulation sub-layer 81 and the second encapsulation sub-layer 82 can be inorganic insulating materials such as silicon nitride and silicon oxide, and the second encapsulation sub-layer 82 can be formed by an Atomic Layer Deposition (ALD) process. A material of the third encapsulation sub-layer 83 may be an organic material, and the third encapsulation sub-layer 83 may be formed by a Molecular Layer Deposition (MLD) process. It should be noted that the first encapsulation layer 8 may also adopt other structures, and the structure of the first encapsulation layer 8 is not particularly limited herein.

In addition, in some embodiments of the present disclosure, the display panel of the present disclosure may further include a transparent cover plate 10, which may cover a side of the color filter layer 7 away from the driving backplane 1. The transparent cover plate 10 may be a single-layer or multi-layer structure, and its material is not particularly limited here.

In some embodiments of the present disclosure, the display panel of the present disclosure may further include a second encapsulation layer 9, which may cover a surface of the color filter layer 7 away from the driving backplane 1, so as to achieve planarization, facilitate the covering of the transparent cover plate 10, and improve encapsulation effect to further block water and oxygen. The second encapsulation layer 9 may be a single-layer or multi-layer structure, and may include the inorganic material such as silicon nitride and silicon oxide, or may include the organic material, and a structure of the second encapsulation layer 9 is not particularly limited herein.

A solution for solving a cross-color problem of the display panel of the present disclosure will be described in detail below.

Since the individual light-emitting units 001 share the light-emitting layer 5, the carriers (such as holes) of one light-emitting unit 001 may move towards other light-emitting units 001 through a film layer such as the charge generation layer 52, especially moving towards an adjacent light-emitting unit 001, that is, the leakage occurs, which affects luminescence purity. To this end, as shown in FIGS. 4 and 8, the conductive shielding layer 4 may be disposed in an area between the planarization layer 104 and the light-emitting layer 5 and between two adjacent light-emitting units 001, and the conductive shielding layer 4 is insulated from the first electrode 21, but the conductive shielding layer 4 is conductive. The carriers can be absorbed by the conductive shielding layer 4 to prevent the carriers from moving between the light-emitting units 001, thereby avoiding the cross color caused by the leakage.

As shown in FIGS. 4 and 8, the conductive shielding layer 4 may be a single-layer or multi-layer structure. For example, in some embodiments of the present disclosure, the conductive shielding layer 4 includes a first conductive layer 401, a second conductive layer 402 and a third conductive layer 403 sequentially stacked in the direction away from the driving backplane 1. Materials of the first conductive layer 401 and the third conductive layer 403 can be the same as materials of the second layer 202 and the fourth layer 204 of the first electrode layer 2, for example, the materials of the first conductive layer 401 and the third conductive layer 403 are both metal titanium. A material of the second conductive layer 402 can be the same as a material of the third layer of the first electrode layer 2, for example, the material of the second conductive layer 402 is metal aluminum. Therefore, the conductive shielding layer 4 can be formed by at least part of processes of forming the first electrode layer 2, so as to save cost. In addition, a conductive performance of the conductive shielding layer 4 can be made similar to that of the first electrode layer 2 to avoid affecting normal light emission of the first electrode 21.

As shown in FIGS. 4 and 6, the pixel definition layer 3 can be made to correspond to an area outside the light-emitting unit 001, that is, an area outside the opening 31, to form the separation groove 32, so that the light-emitting layer 5 is recessed at the separation groove 32, which is conducive to thinning and even disconnecting the charge generation layer 52 and at least part of the light emitting sub-layers 51 in the light-emitting layer 5, thereby further preventing the leakage.

Figure 21:
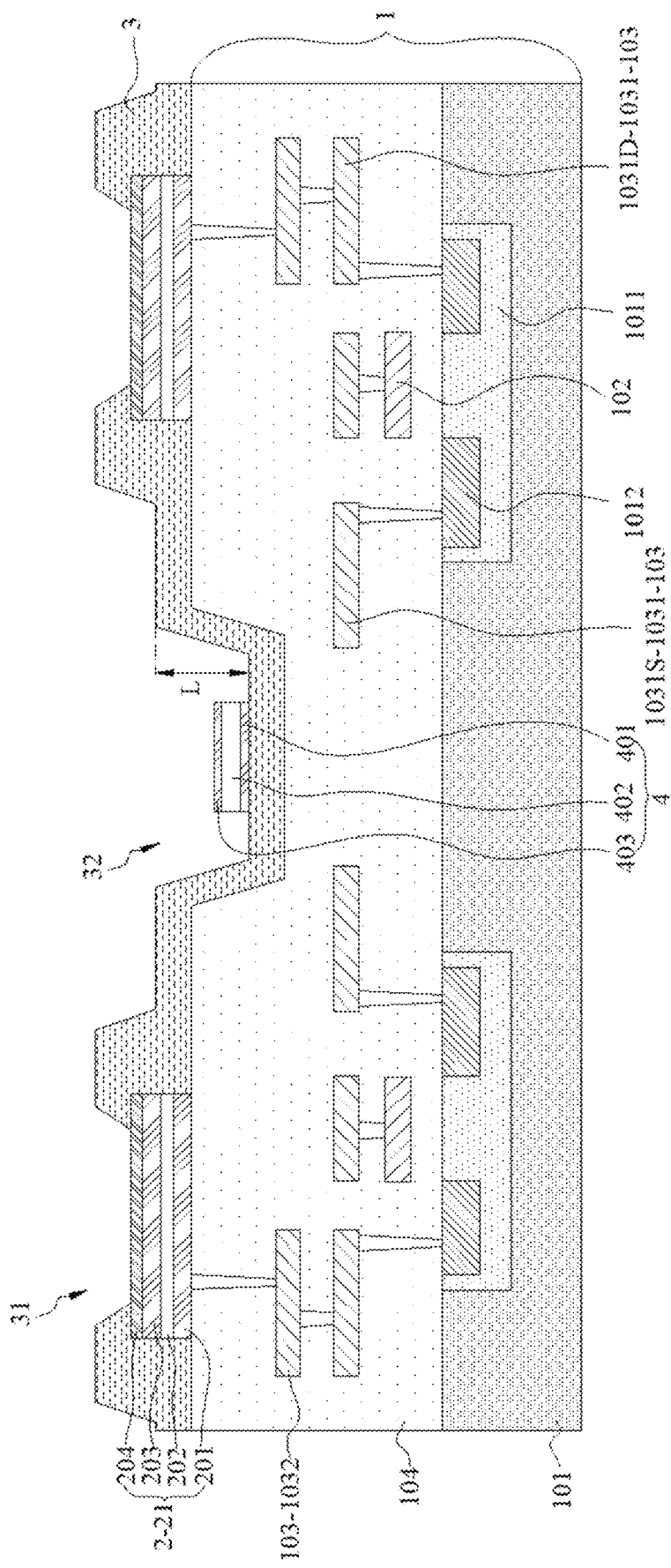
FIGS. 21-25 are schematic structural diagrams of some steps in an embodiment of a manufacturing method for a display panel of the present disclosure.

In order to form the separation groove 32 in the pixel definition layer 3, as shown in FIGS. 4 and 21, the groove 1041 can be disposed in the planarization layer 104 of the driving backplane 1, and the orthographic projection of the groove 1041 on the planarization layer 104 is located outside the first electrode 21. The pixel definition layer 3 may form the separation groove 32 at the groove 1041, and the light-emitting layer 5 is recessed at the separation groove 32, and is also correspondingly recessed at the groove 1041.

At least a partial area of the conductive shielding layer 4 is located in the groove 1041 and is insulated from the first electrode 21. For example, the conductive shielding layer 4 and the first electrode 21 are distributed at an interval and are not coupled to each other. In addition, the conductive shielding layer 4 is at most partially covered by the pixel definition layer 3, so it can directly contact the light-emitting layer 5 recessed into the groove 1041, so that carriers of the light-emitting layer 5 between the two light-emitting units 001 can be extracted. In addition, a thickness of the conductive shielding layer 4 can be smaller than a depth of the groove 1041 to ensure that the light-emitting layer 5 can be recessed into the groove 1041, which is conducive to thinning and even disconnecting the charge generation layer 52 and at least part of the light emitting sub-layers 51 in the light-emitting layer 5, thereby further preventing the leakage.

Figure 20:
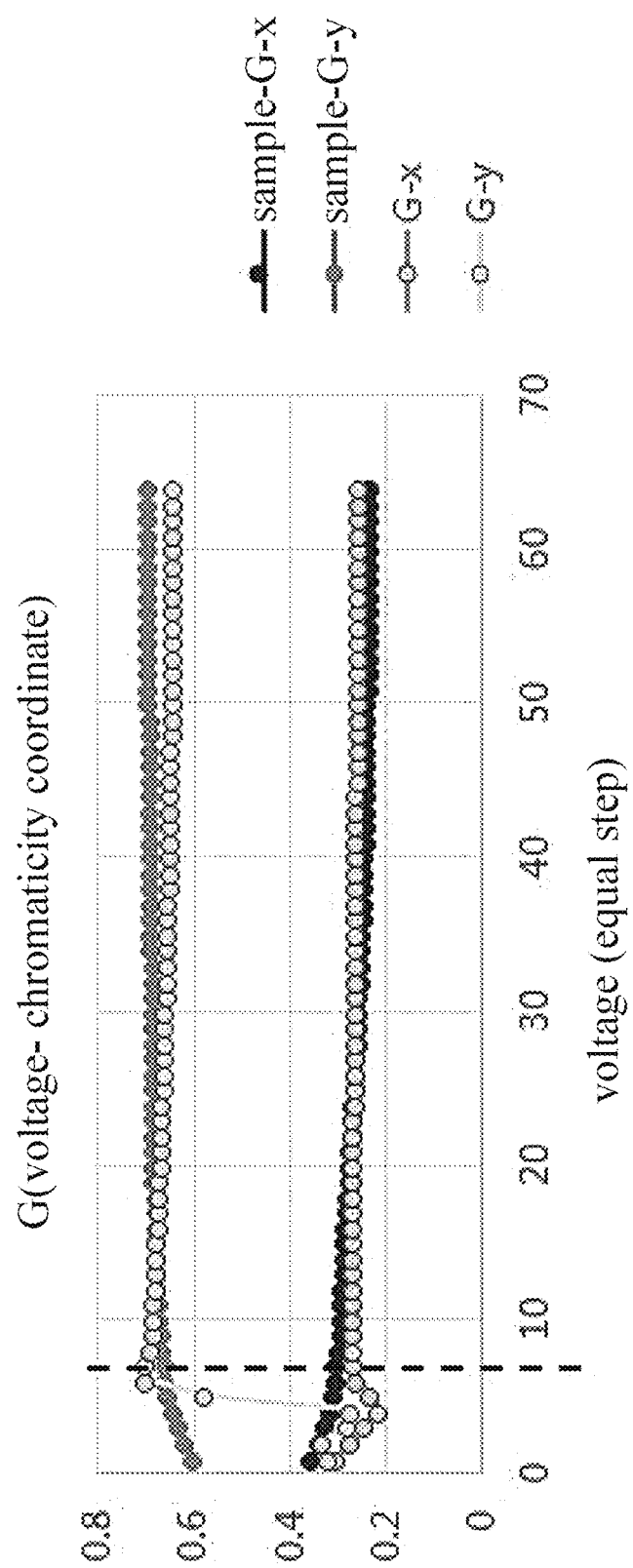
FIG. 20 is a voltage-chromaticity coordinate schematic diagram of a green sub-pixel in an embodiment of a display panel of the present disclosure.

As shown in FIGS. 4, 20 and 21, in some embodiments of the present disclosure, a thickness of the pixel definition layer 3 is smaller than the depth of the groove 1041, and the pixel definition layer 3 is recessed at the groove 1041 to form the separation groove 32. A bottom surface of the separation groove 32 covers a bottom surface of the groove 1041, that is, the separation groove 32 does not penetrate the pixel definition layer 3 in a depth direction. In order to prevent the groove 1041 from exposing the wiring layer 103, each wiring layer 103 can be located on a side of the bottom surface of the groove 1041 close to the substrate 101 without being exposed by the groove 1041. In addition, at least a partial area of the conductive shielding layer 4 is located in the separation groove 32, for example, the conductive shielding layer 4 is at least partially stacked on the bottom surface of the separation groove 32, that is, the conductive shielding layer 4 is at least partially disposed on a side of the bottom surface of the separation groove 32 away from the substrate 101. In addition, an area of the conductive shielding layer 4 on the bottom of the separation groove 32 is smaller than an area of the bottom surface of the separation groove 32, that is, the conductive shielding layer 4 does not completely cover the bottom surface of the separation groove 32.

As shown in FIGS. 4 and 21, in order to ensure that the light-emitting layer 5 can be recessed at the separation groove 32, a depth L of the separation groove 32 can be 800 μm-1000 μm, such as 800 μm, 900 μm or 1000 μm. It should be noted that the bottom surface of the separation groove 32 is not limited to a plane, but can be a curved surface or an irregular surface. The depth of the separation groove 32 refers to a distance between a point on the bottom surface of the separation groove 32 closest to the substrate 101 and the pixel definition layer 3.

Figure 25:
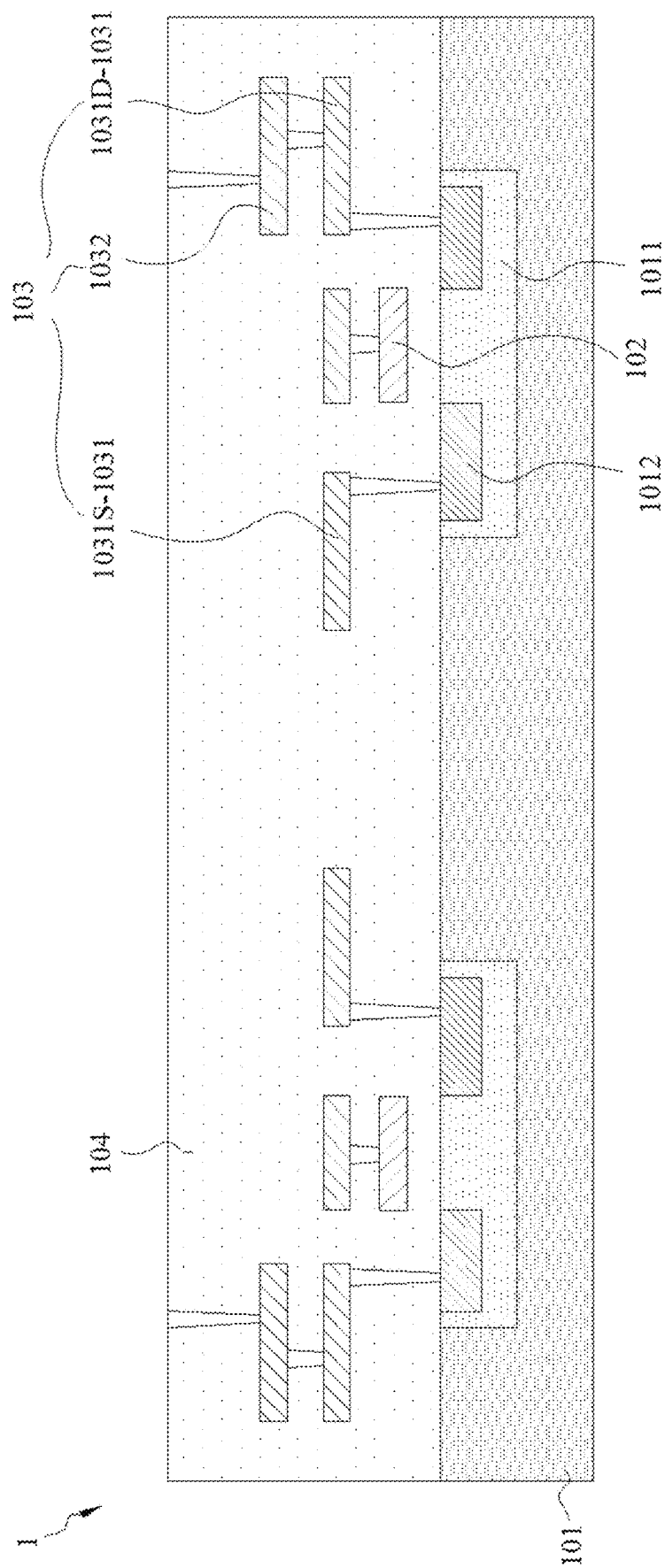

As shown in FIGS. 8 and 25, in other embodiments of the present disclosure, the pixel definition layer 3 may be recessed along the inside of the groove 1041, but the pixel definition layer 3 exposes at least a partial area of the bottom surface of the groove 1041 while covering a side wall of the groove 1041. The conductive shielding layer 4 is disposed on the bottom surface of the groove 1041 and at least a partial area of the conductive shielding layer 4 is exposed by the pixel definition layer 3, so that the light-emitting layer 5 recessed into the groove 1041 can directly contact the conductive shielding layer 4. Since both the conductive shielding layer 4 is stacked on the planarization layer 104 and the first electrode layer 21 is stacked on the planarization layer 104, the conductive shielding layer 4 and the first electrode layer 21 can be simultaneously formed through the same process to simplify the process. It should be noted that they can also be formed independently.

In other embodiments of the present disclosure, the pixel definition layer 3 may be located outside a boundary of the groove 1041 without extending into the groove 1041, that is, the pixel definition layer 3 does not cover the side wall and the bottom surface of the groove 1041, so that the pixel definition layer 3 forms the separation groove 32 penetrating the pixel definition layer 3 at the groove 1041. A side wall of the separation groove 32 may be aligned with the side wall of the groove 1041 or located outside the side wall of the groove 1041, thereby exposing the groove 1041. The conductive shielding layer 4 can be disposed on the bottom surface of the groove 1041 without being covered by the pixel definition layer 3, so that the light-emitting layer 5 recessed into the groove 1041 can directly contact the conductive shielding layer 4. Since both the conductive shielding layer 4 is stacked on the planarization layer 104 and the first electrode layer 21 is stacked on the planarization layer 104, the conductive shielding layer 4 and the first electrode layer 21 can be simultaneously formed through the same process to simplify the process. It should be noted that they can also be formed independently.

In order to avoid the leakage to the greatest extent, the light-emitting unit 001 can be surrounded by the conductive shielding layer 4 and the separation groove 32. Taking the above-mentioned embodiment in which the conductive shielding layer 4 is stacked on the bottom surface of the separation groove 32 as an example, as shown in FIGS. 4 and 6, in some embodiments of the present disclosure, the separation groove 32 includes at least one annular groove body 321, and one groove body 321 surrounds outside one first electrode 21, and correspondingly, the conductive shielding layer 4 may include at least one shielding ring 41, one shielding ring 41 is disposed in one groove body 321, and the shielding ring 41 can be stacked on a bottom surface of the groove body 321. The first electrode 21 can be surrounded by the groove body 321 and the shielding ring 41 in the groove body 321, that is, the light-emitting unit 001 is surrounded. In addition, each shielding ring 41 can be coupled to the second electrode 6 so as to extract the carriers absorbed by the conductive shielding layer 4, so that the leakage from the light-emitting unit 001 to the adjacent light-emitting unit 001 is difficult.

A ratio of a width of the shielding ring 41 to a width of the groove 1041 may be less than 4:5, so that there is a certain distance between the shielding ring 41 and the side wall of the groove 1041. It should be noted that the width ratio may also be larger or smaller, and the width of the shielding ring 41 is a distance between an inner wall and an outer wall of the shielding ring 41. In addition, the thickness of the conductive shielding layer 4 may be greater than a thickness of the pixel definition layer 3. Furthermore, the conductive shielding layer 4 can be located on a side of the first electrode 21 close to the substrate 101, that is, the conductive shielding layer 4 does not extend beyond the groove 1041, that is, the conductive shielding layer 4 is located on a side of a surface of the planarization layer 104 on which the first electrode 21 is disposed close to the substrate 101.

Further, as shown in FIG. 6, the separation groove 32 may include a plurality of groove bodies 321, the conductive shielding layer 4 may include a plurality of shielding rings 41, and the number of the groove bodies 321 and the number of the shielding rings 41 may be the same as the number of the first electrodes 21. Each groove body 321 is provided with one shielding ring 41, and the groove body 321 and the shielding ring 41 can be an annular structure concentrically disposed. Each groove body 321 and the shielding ring 41 therein can surround outside one first electrode 21.

It should be noted that, for the separation groove 32 formed by being recessed into the groove 1041, a shape of the groove 1041 directly limits a shape of the separation groove 32. Therefore, if the separation groove 32 includes the plurality of annular groove bodies 321, the groove 1041 also includes a plurality of annular groove bodies.

Figure 11:
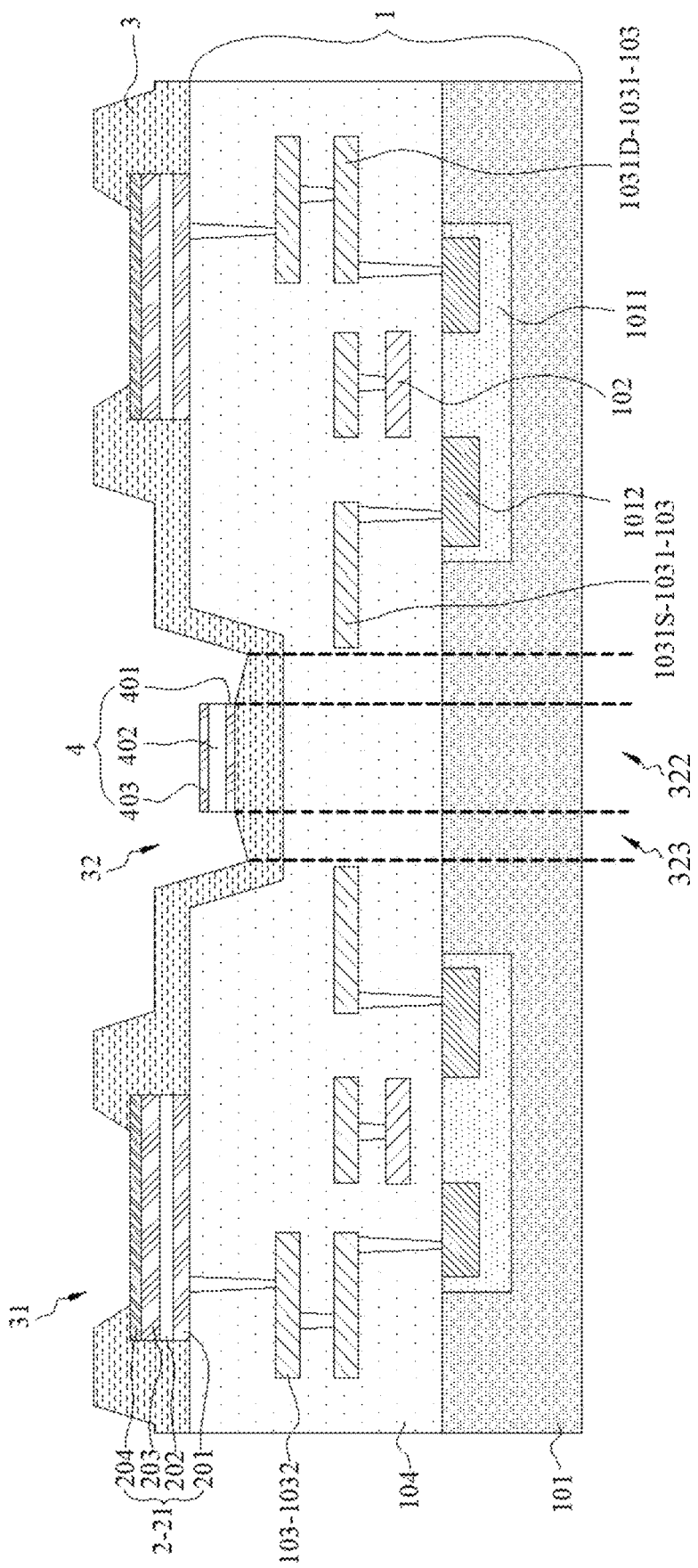
FIG. 11 is a schematic diagram of a middle area and an edge area of a separation groove in an embodiment of a display panel of the present disclosure.

As shown in FIG. 11, in some embodiments of the present disclosure, the bottom surface of the separation groove 32 may include a middle area 322 and an edge area 323 located outside the middle area 322. An orthographic projection of the conductive shielding layer 4 on the bottom surface of the separation groove 32 coincides with the middle area 322, and a thickness of the middle area 322 is greater than a thickness of the edge area 323, that is, a thickness of an area of the bottom surface of the separation groove 32 that is covered by the conductive shielding layer 4 is greater than a thickness of an area of the bottom surface of the separation groove 32 that is not covered by the conductive shielding layer 4.

Figure 12:
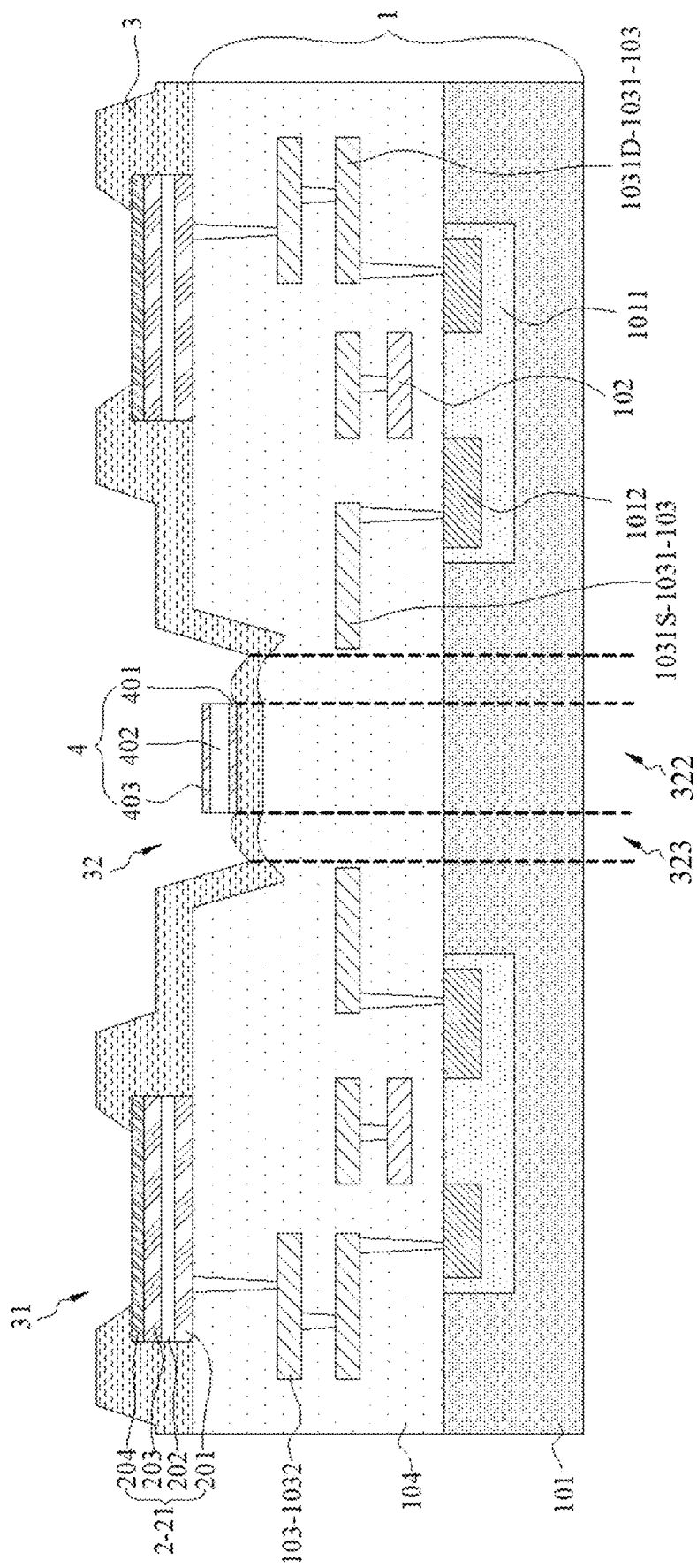
FIG. 12 is a schematic diagram of a middle area and an edge area of a separation groove in another embodiment of a display panel of the present disclosure.

As shown in FIG. 12, in other embodiments of the present disclosure, at least a partial area of the edge area 323 is located on a side of the middle area 322 away from the substrate 101, that is, the maximum distance between the edge area 323 and the substrate 101 is greater than the maximum distance between the middle area 322 and the substrate 101, so that the middle area 322 is recessed toward the substrate 101 with respect to the edge area 323. In addition, a shape of the edge area 323 may be a curved surface protruding toward a side of the middle area 322 away from the substrate 101, and the edge area 323 is coupled between the side wall of the separation groove 32 and the middle area 322.

Further, in order to form the above-mentioned structure in which the middle area 322 is recessed toward the substrate 101 with respect to the edge area 323, the bottom surface of the groove 1041 of the planarization layer 104 can form a middle portion and side portions on both sides of the middle portion, and the side portions protrude toward a side of the middle portion away from the substrate 101, so that the middle portion is recessed relative to the side portion. When the pixel definition layer 3 is formed, the pixel definition layer 3 covering the bottom surface of the groove 1041 forms a morphology that matches the bottom surface of the groove 1041, that is, the above-mentioned middle area 322 and edge area 323 are formed. It should be noted that when the bottom surface of the groove 1041 is a plane or in other shapes, the above-mentioned middle area 322 and edge area 323 can also be formed by controlling the thickness of the pixel definition layer 3 in the groove 1041.

In the direction perpendicular to the substrate 101, the shielding ring 41 may have an uneven structure.

Figure 13:
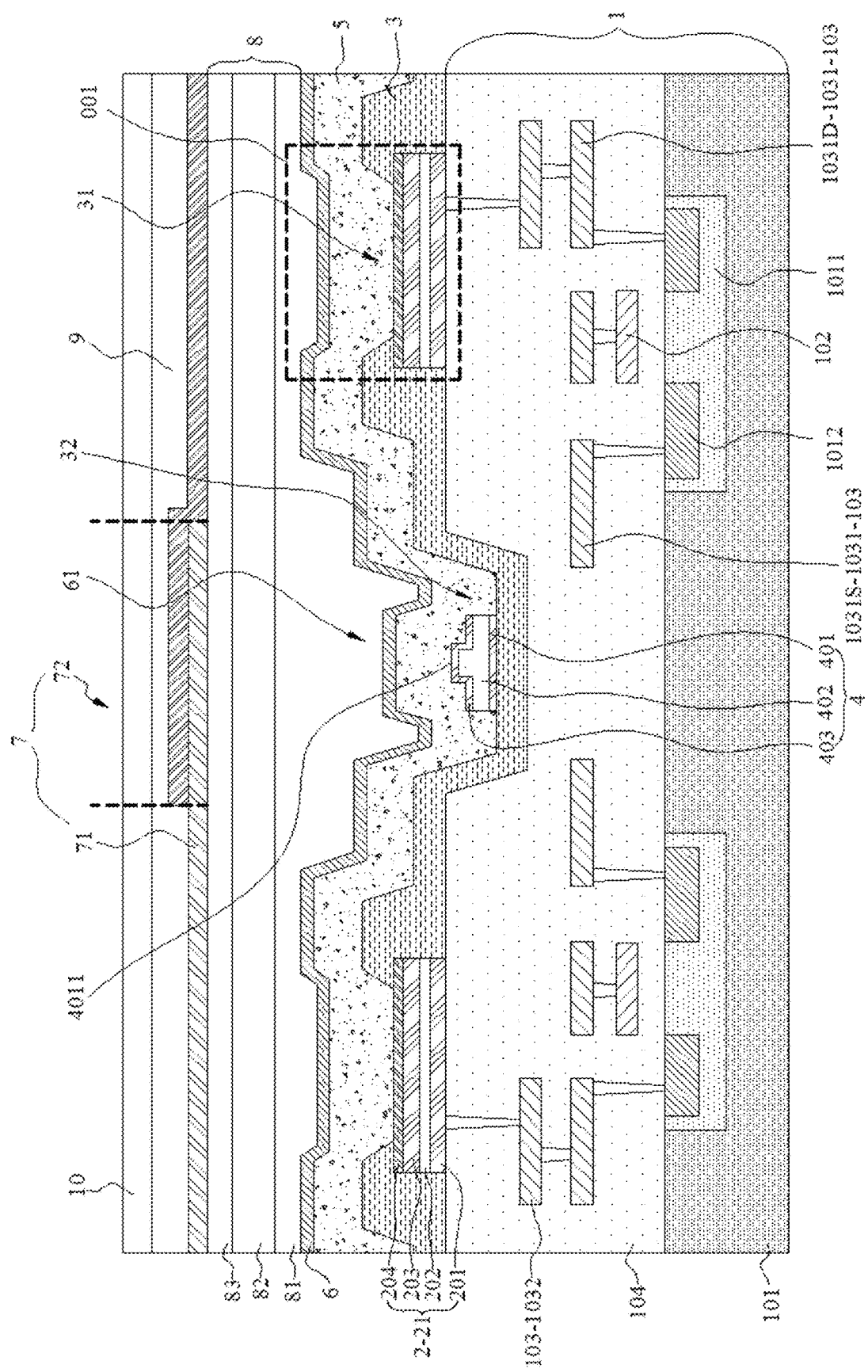
FIG. 13 is a schematic diagram of a ridge of a shielding ring in an embodiment of a display panel of the present disclosure.

For example, as shown in FIG. 13, in some embodiments of the present disclosure, a surface of the shielding ring 41 away from the substrate 101 may be provided with a ridge 4011 extending in a circumferential direction, and areas of the surface of the shielding ring 41 away from the substrate 101 that are located at two sides of the ridge 4011 may be planes. In addition, the ridge 4011 and the shielding ring 41 are an integral structure, which may be formed by making the third conductive layer 403 protrude. The protruding of the third conductive layer 403 may be formed by increasing its own thickness, or may be formed by making the first conductive layer 401 and the second conductive layer 402 protrude.

Figure 14:
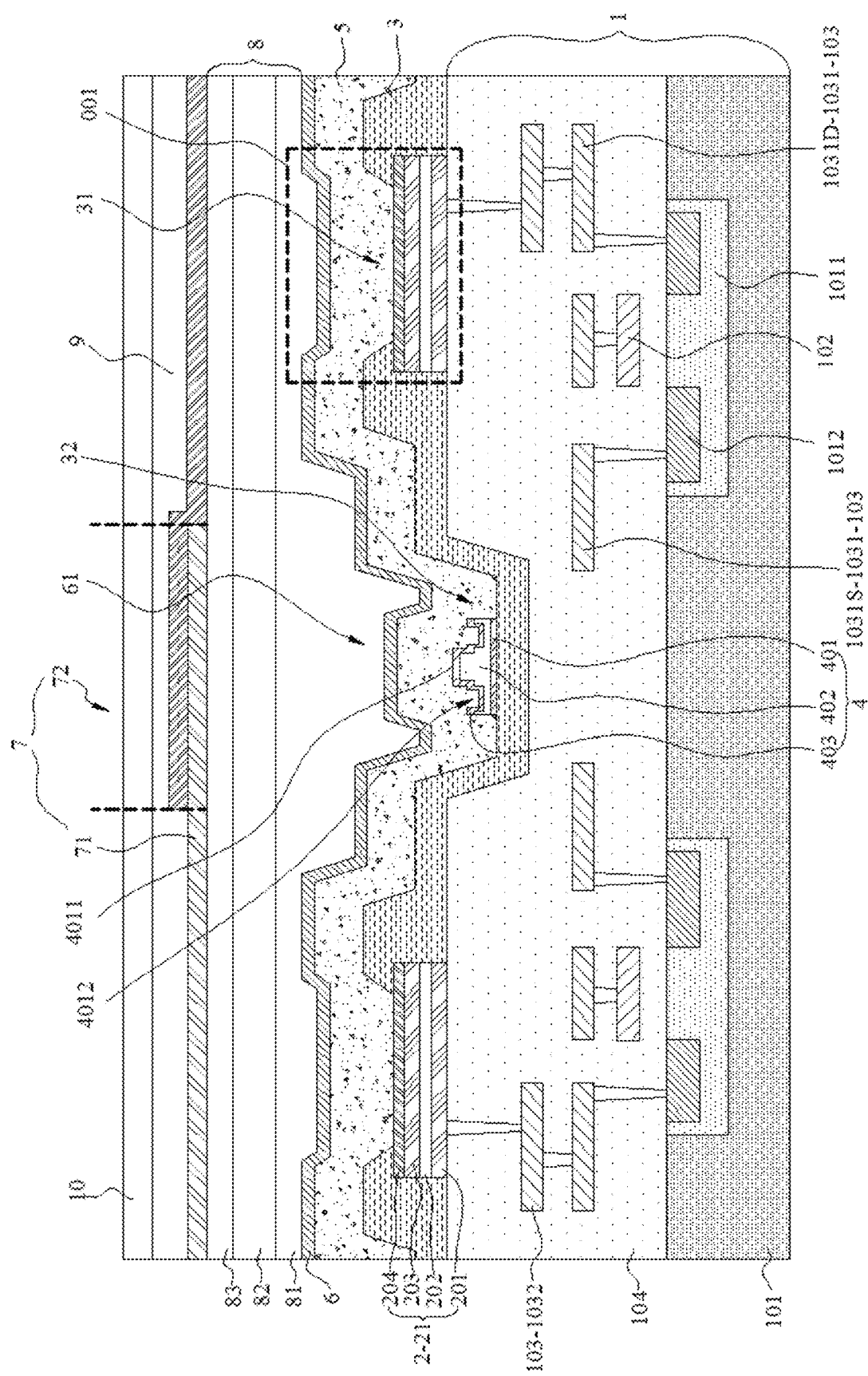
FIG. 14 is a schematic diagram of a ridge and a depression of a shielding ring in an embodiment of a display panel of the present disclosure.

As shown in FIG. 14, in other embodiments of the present disclosure, the surface of the shielding ring 41 away from the substrate 101 is provided with the above-mentioned ridge 4011, and may also be provided with a depression 4012 extending in the circumferential direction. The ridge 4011 and the depression 4012 may be distributed along a radial direction of the shielding ring 41, that is, distributed from the inner wall to the outer wall of the shielding ring 41. For example, there are two depressions 4012, and the two depressions 4012 are concentrically disposed, and there is one ridge 4011 located between the two depressions 4012. It should be noted that the number of the ridges 4011 and the number of the depressions 4012 are not limited to this, as long as the ridge 4011 and the depression 4012 are distributed along the radial direction of the shielding ring 41.

In order to facilitate the extraction of the carriers absorbed by the conductive shielding layer 4, the conductive shielding layer 4 can be coupled to the peripheral circuit. Meanwhile, a power signal can be input to the conductive shielding layer 4, and a voltage difference between this power signal and a power signal input to the second electrode 6 is smaller than a turn-on voltage difference that enables the light-emitting layer 5 to emit the light, thereby avoiding the light-emitting layer 5 between the conductive shielding layer 4 and the second electrode 6 emitting the light, while only the light-emitting layer 5 between the first electrode 21 and the second electrode 6 emits the light. For example, the conductive shielding layer 4 can be coupled to the second electrode 6. Although the light-emitting layer 5 also exists between the conductive shielding layer 4 and the second electrode 6, the conductive shielding layer 4 is coupled to the second electrode 6 and is in the same potential as the second electrode 6, the voltage difference is zero, thus the light-emitting layer 5 cannot be driven to emit the light. In addition, the conductive shielding layer 4 can also be directly grounded through the peripheral circuit, or can receive other signals, as long as the carriers can be extracted so as to avoid the leakage between adjacent light-emitting units 001, and an area of the light-emitting layer 5 corresponding to the conductive shielding layer will not emit the light.

The following describes how the shielding ring 41 is coupled to the second electrode 6 in detail.

In some embodiments of the present disclosure, as shown in FIG. 6, in order to facilitate the coupling of the shielding rings 41 with the second electrode 6, the shielding rings 41 may be coupled into an integral structure, and correspondingly, individual groove bodies 321 of the separation groove 32 can in communication with each other to form an integral structure. For example, the conductive shielding layer 4 may further include a connection body 42, an orthographic projection of the connection body 42 on the driving backplane 1 extends from the pixel area 110 to the peripheral area 120, the connection body 42 is coupled to at least one shielding ring 41, and an area of the connection body 42 corresponding to the peripheral area 120 is coupled to the second electrode 6. There may be a plurality of connection bodies 42, which are distributed around the pixel area 110. Each connection body 42 can be coupled to one shielding ring 41, and since the individual shielding rings 41 are coupled into the integral structure, each connection body 42 is electrically coupled to each shielding ring 41. A structure of the connection body 42 may be a wire or the like, which is not particularly limited here, as long as it can function as a conductive connection.

Further, an orthographic projection of the light-emitting layer 5 on the driving backplane 1 covers the pixel area 110 and extends into the peripheral area 120, and has a certain distance from a boundary of the peripheral area 120. A boundary of an orthographic projection of the second electrode 6 on the driving backplane 1 is located outside a boundary of the light-emitting layer 5. The connection body 42 can extend beyond the boundary of the light-emitting layer 5 and directly contact an area of the second electrode 6 outside the boundary of the light-emitting layer 5, so that the second electrode 6 is coupled to the shielding ring 41 via the connection body 42.

Figure 9:
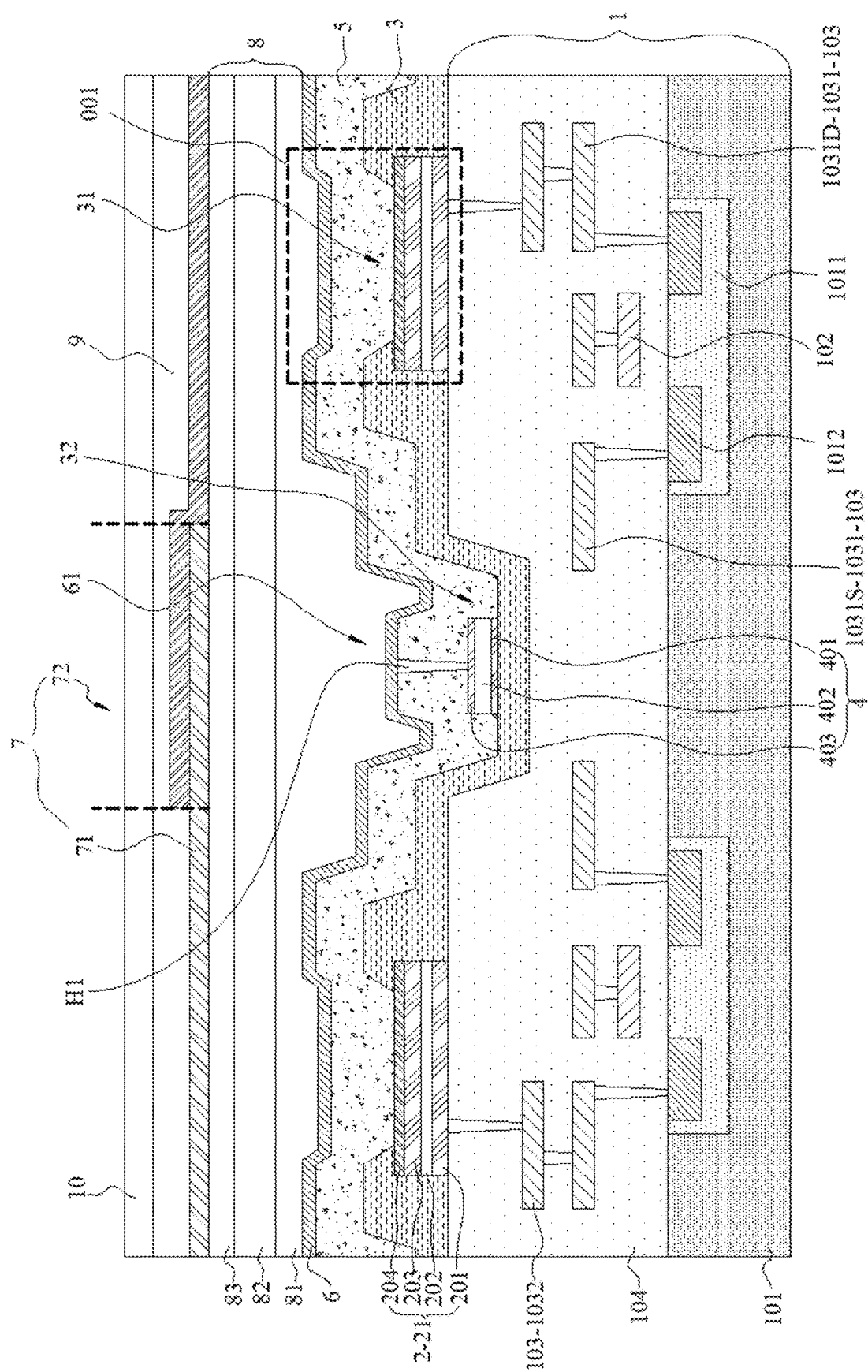
FIG. 9 is a schematic diagram of still another embodiment of a display panel of the present disclosure.

As shown in FIG. 9, in other embodiments of the present disclosure, at least a part of the shielding ring 41 may be coupled to the second electrode 6 through a first via hole H1 penetrating the light-emitting layer 5, and an orthographic projection of at least one first via hole H1 on the planarization layer 104 is located between two adjacent first electrodes 21. If the individual shielding rings 41 are the integral structure, only one shielding ring 41 is at least coupled to the second electrode 6. It should be noted that a plurality of first via holes H1 can be disposed to couple the plurality of shielding rings 41 to the second electrode 6, and the plurality of first via holes H1 can be used to couple each shielding ring 41 to the second electrode 6, an orthographic projection of each first via hole H1 on the driving backplane 1 is located in the pixel area 110.

Figure 10:
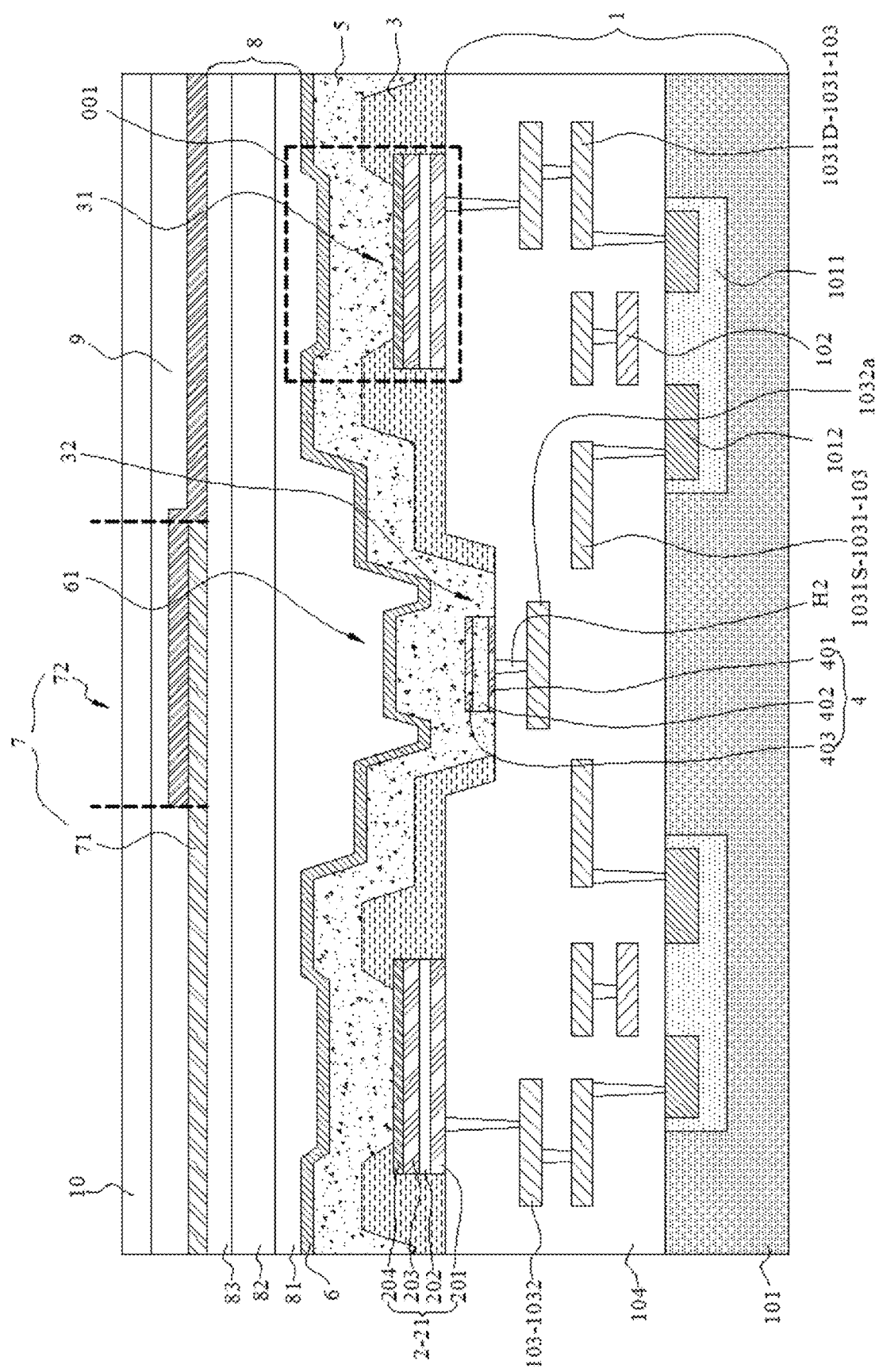
FIG. 10 is a schematic diagram of yet another embodiment of a display panel of the present disclosure.

As shown in FIG. 10, in other embodiments of the present disclosure, the at least one wiring layer 103 may include a connection portion 1032a, for example, the second wiring layer 1032 may include the connection portion 1032a. A potential of the connection portion 1032a can be the same as a potential of the second electrode 6. For example, the connection portion 1032a can extend to the peripheral area and can be coupled to the second electrode 6. A signal with the same potential as the power signal input to the second electrode 6 can also be input to the connection portion 1032a. In addition, the planarization layer 104 may be provided with a second via hole H2 coupled to the connection portion 1032a, and the second via hole H2 may be coupled to the shielding ring 41, thereby coupling the shielding ring 41 to the second electrode 6. Alternatively, the potential of the shielding ring 41 is equal to the potential of the second electrode 6, so as to prevent the light-emitting layer 5 between the shielding ring 41 and the second electrode 6 from emitting the light.

It should be noted that, if the conductive shielding layer 4 is stacked on the pixel definition layer 3, that is, stacked on the bottom surface of the separation groove 32, the second via hole H2 can penetrate the pixel definition layer 3. If the conductive shielding layer 4 is disposed on the bottom surface of the groove 1041, the second via hole H2 does not need to penetrate the pixel definition layer 3.

Further, due to the existence of the separation groove 32, the second electrode 6 is recessed at the separation groove 32 to form a recessed area 61, and a depth of the recessed area 61 is not greater than a depth of the separation groove 32. In addition, since at least a partial area of the conductive shielding layer 4 is disposed in the separation groove 32, an area of a bottom surface of the recessed area 61 corresponding to the conductive shielding layer 4 protrudes toward a direction away from the conductive shielding layer 4, and a height of the protrusion is smaller than the depth of the separation groove 32.

Effects of the display panel of the present disclosure are described below.

Figure 15:
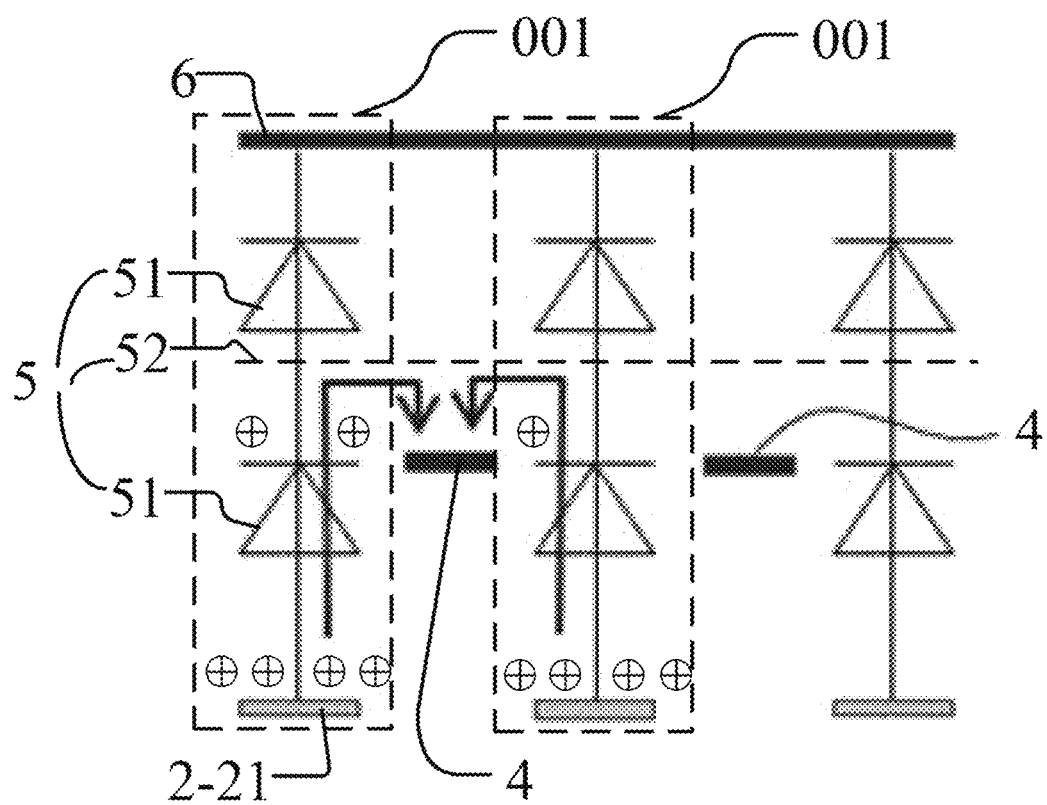
FIG. 15 is a schematic circuit diagram of preventing leakage in a display panel of the present disclosure.

FIG. 15 shows a circuit principle of the conductive shielding layer 4 absorbing the carriers, and as shown in FIG. 15, it can be seen that the carriers (holes) between two adjacent light-emitting units 001 are absorbed by the conductive shielding layer 4, avoiding the leakage between the two light-emitting units 001.

Figure 16:
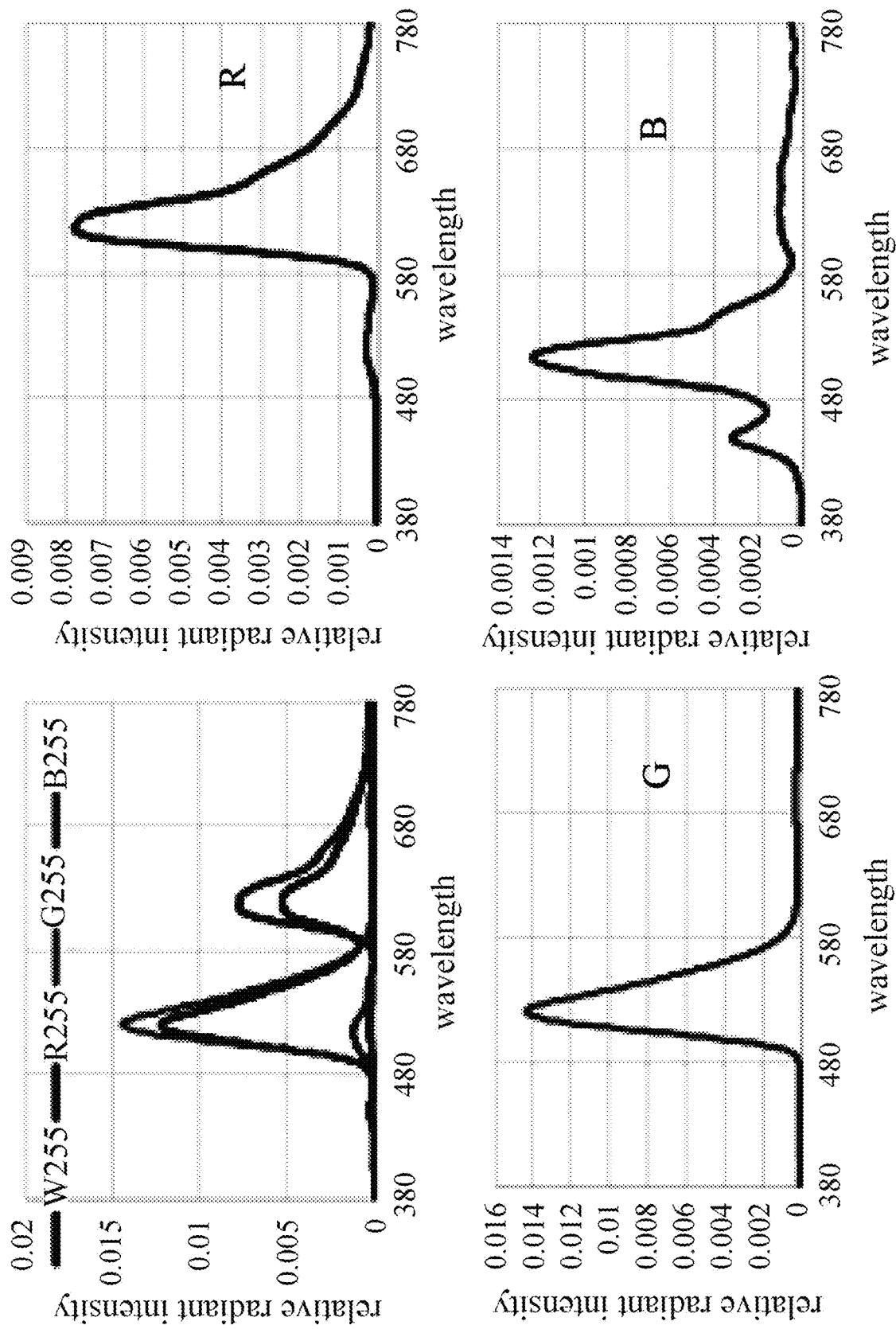
FIG. 16 is a spectrogram of an embodiment of a display panel of the present disclosure.

FIG. 16 shows a spectrogram in which three sub-pixels of red (R), green (G), and blue (B) are lit at the same time and spectrograms in which the three sub-pixels of red (R), green (G), and blue (B) are lit separately, and as shown in FIG. 16, compared with the spectrograms of the related art in FIG. 3, it can be seen that in the display panel of the present disclosure, when the three sub-pixels are separately lit, the light of different colors is obviously reduced, so that the color gamut of the entire display panel is improved. According to measurement and calculation, a color gamut index (NTSC) of the display panel can reach 80%.

Figure 17:
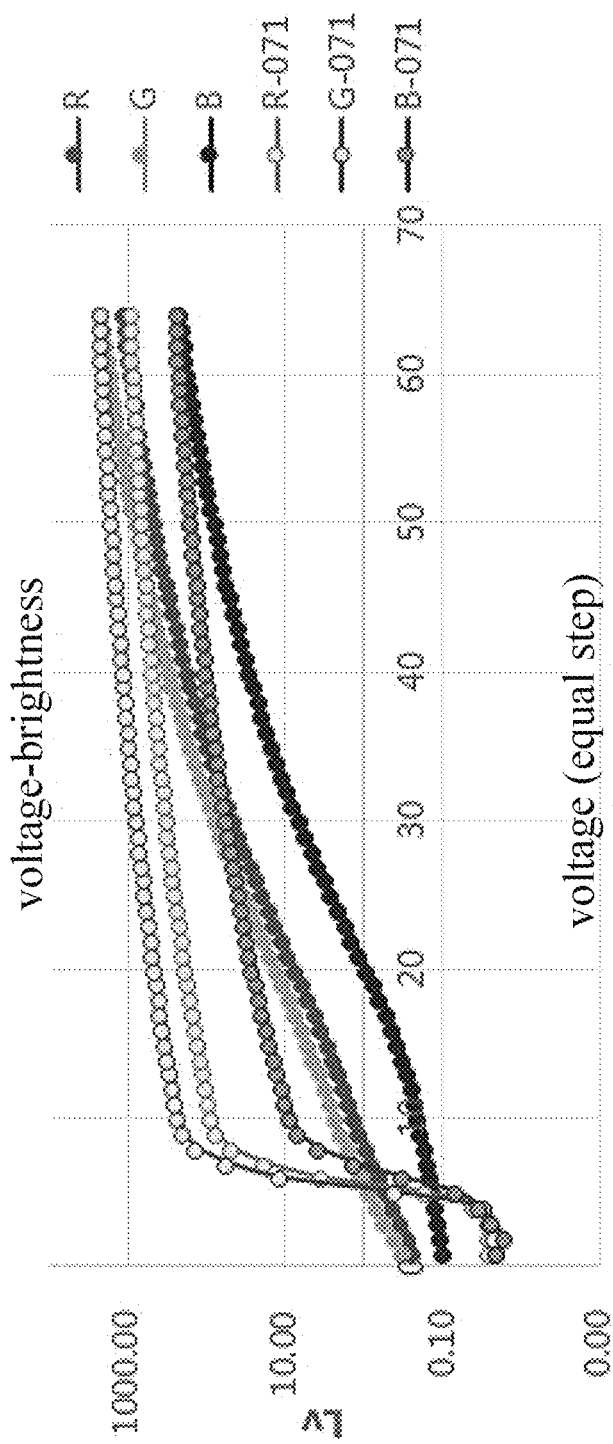
FIG. 17 is a voltage-brightness schematic diagram of an embodiment of a display panel of the present disclosure.
Figure 18:
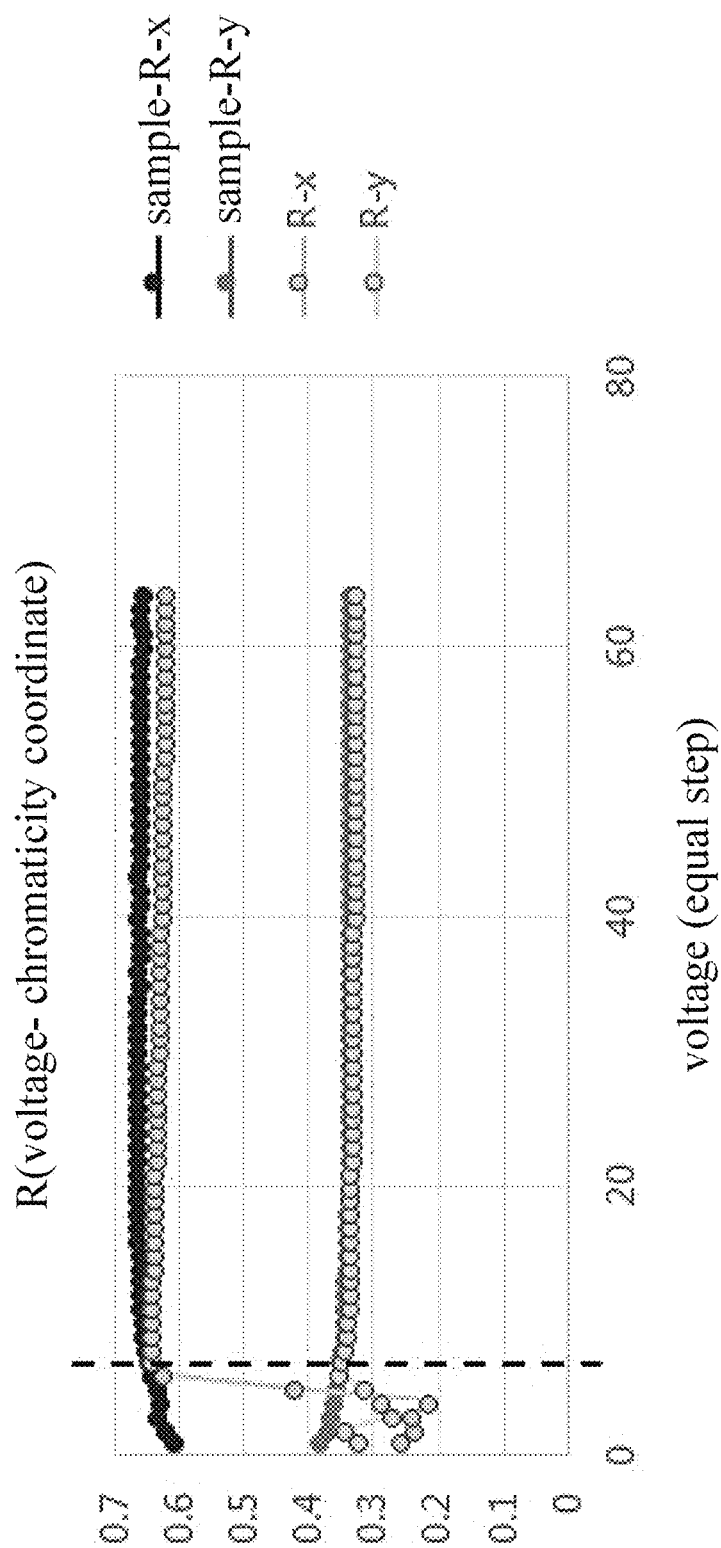
FIG. 18 is a voltage-chromaticity coordinate schematic diagram of a red sub-pixel in an embodiment of the display panel of the present disclosure.
Figure 19:
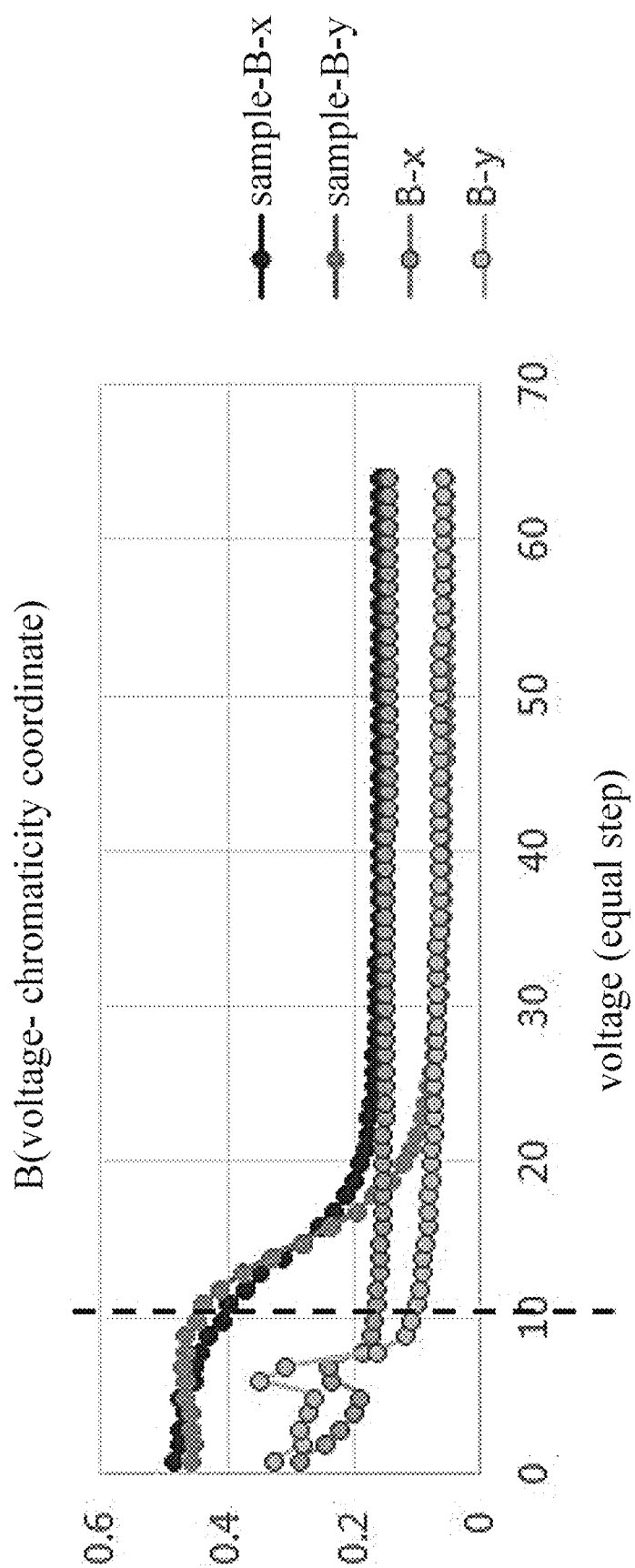
FIG. 19 is a voltage-chromaticity coordinate schematic diagram of a blue sub-pixel in an embodiment of a display panel of the present disclosure.

FIG. 17 shows voltage-brightness curves of three sub-pixels of red (R), green (G), and blue (B), and as shown in FIG. 17, R, G, and B curves are curves of three sub-pixels in an embodiment of the present disclosure, and R-071, G-071 and B-071 are curves of three sub-pixels in the related art. FIGS. 18 to 20 respectively show voltage-chromaticity coordinate curves of three sub-pixels of red (R), green (G), and blue (B), where sample-R-x, sample-R-y, sample-G-x, sample-G-y, sample-B-x, sample-B-y curves are chromaticity coordinate curves of three sub-pixels in an embodiment of the disclosure, and R-x, R-y, G-x, G-y, B-x, B-y curves are chromaticity coordinate curves of three sub-pixels in the related art.

It can be seen from FIGS. 18-20 that the display panel in the related art has obvious brightness and chromaticity coordinate changes under a low voltage (left of the dotted line), and is accompanied by jumping and inversion problems as the voltage changes, so that Gamma debugging is difficult under a low gray scale, and it is more prone to a color bar problem. In the display panel according to the embodiments of the present disclosure, an amplitude of each monochromatic chromaticity coordinate changing with the voltage is significantly reduced, which is beneficial to the Gamma debugging, and the transition of the curve is smooth without the jumping problem.

To sum up, it can be seen that some embodiments of the display panel of the present disclosure can prevent the leakage, thereby avoiding the cross-color problem.

The present disclosure further provides a manufacturing method for a display panel, and the display panel may be the display panel of any of the above-mentioned embodiments. As shown in FIG. 4 and FIGS. 21-25 and FIG. 27, the manufacturing method may include steps S110-S170.

In the step S110, a driving backplane is formed, and the driving backplane includes a substrate, at least one wiring layer and a planarization layer, the wiring layer is disposed on a side of the substrate, and the wiring layer is covered by the planarization layer, as shown in FIG. 25.

Figure 23:
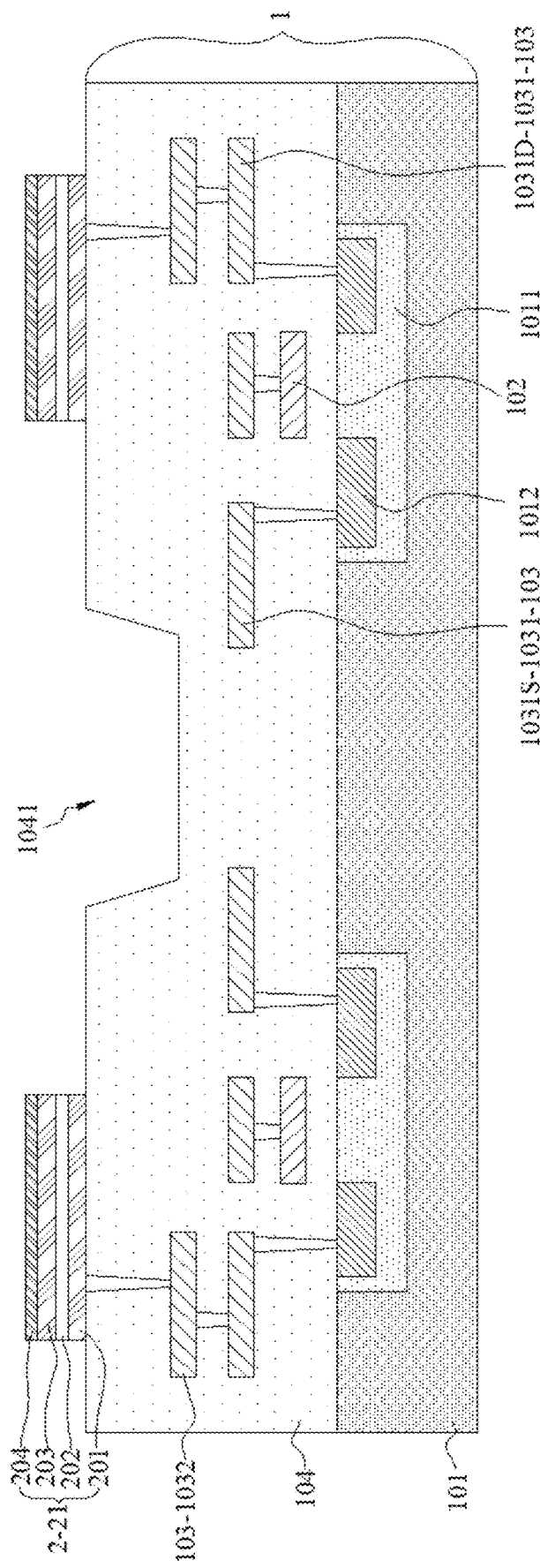

In the step S120, a groove is opened in the planarization layer, as shown in FIGS. 21 and 23.

Figure 24:
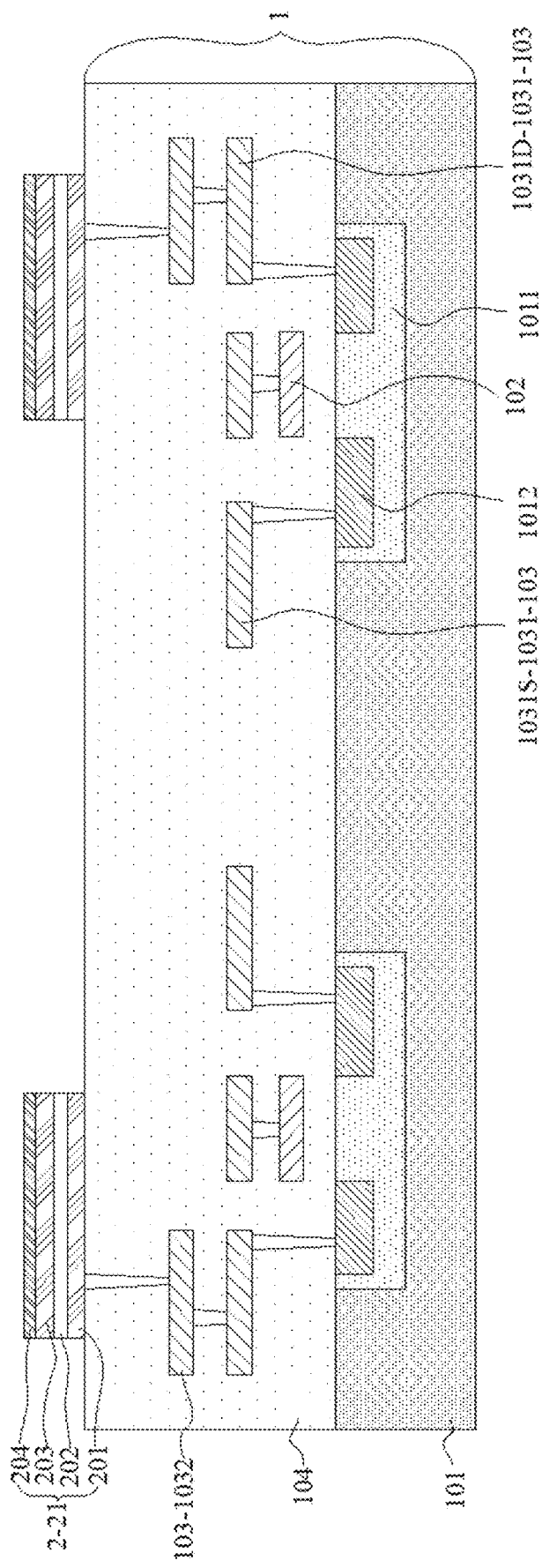

In the step S130, a first electrode layer is formed on a surface of the planarization layer away from the substrate, and the first electrode layer includes a plurality of first electrodes distributed at intervals, an orthographic projection of the groove on the planarization layer is located outside the first electrodes, as shown in FIGS. 23-24.

Figure 22:
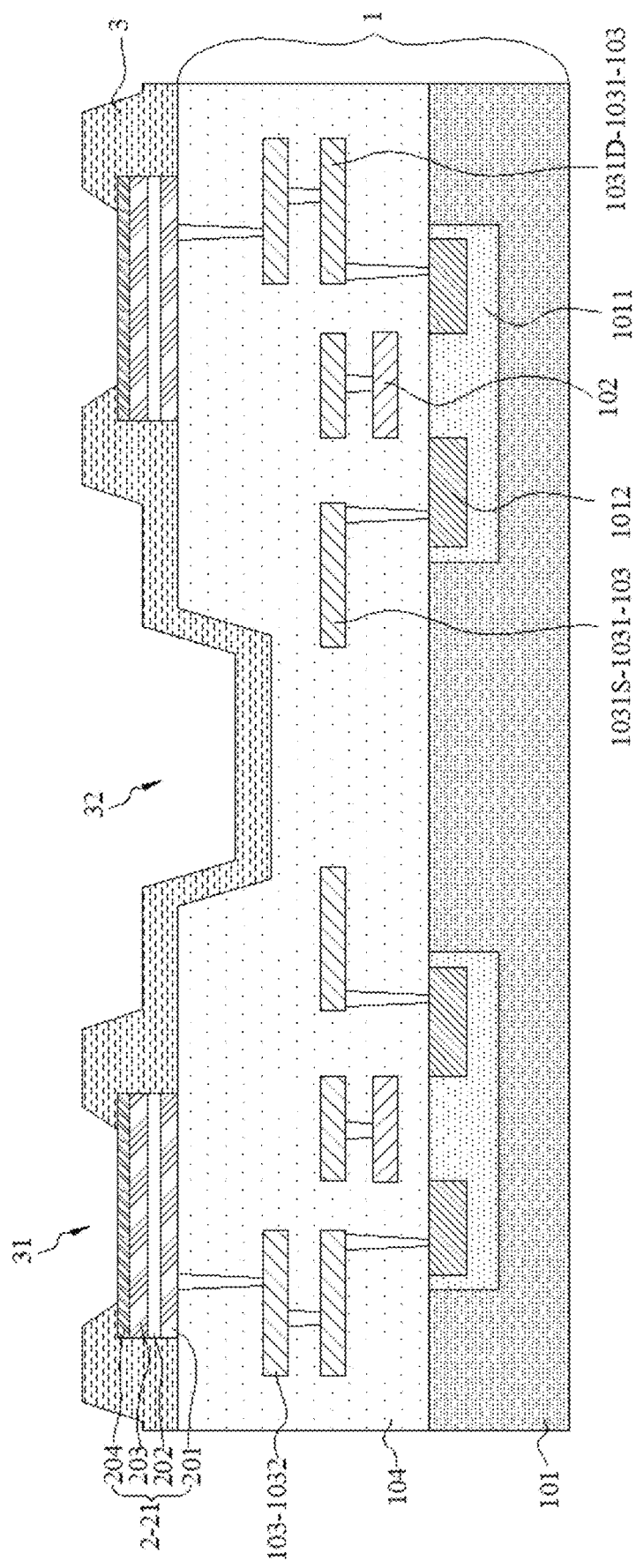

In the step S140, a pixel definition layer exposing each first electrode is formed on the surface of the planarization layer away from the substrate, and a separation groove is formed by the pixel definition layer at the groove, as shown in FIGS. 22 and 23.

In the step S150, a conductive shielding layer is formed at least in the separation groove, as shown in FIG. 21.

In the step S160, a light-emitting layer covering the pixel definition layer, the first electrodes and the conductive shielding layer is formed, and the light-emitting layer is recessed at the separation groove and is in direct contact with at least a partial area of the conductive shielding layer, as shown in FIG. 4.

In the step S170, a second electrode covering the light-emitting layer is formed, as shown in FIG. 4.

A structure in each step of the manufacturing method of the embodiments of the present disclosure has been described in detail in the embodiments of the display panel above, and will not be described in detail here.

In some embodiments of the present disclosure, the step S110 includes steps S1110 and S1120.

In the step S1110, a substrate is formed.

In the step S1120, the at least one wiring layer and the planarization layer covering the wiring layer are formed on a side of the substrate, and the first electrode layer is disposed on the surface of the planarization layer away from the substrate.

In addition, the manufacturing method of the present disclosure may further include step S180:

a color filter layer including a plurality of filter portions is formed on a side of the second electrode away from the driving backplane, and individual first electrodes are disposed opposite to individual filter portions in a direction perpendicular to the substrate, as shown in FIG. 4.

Figure 26:
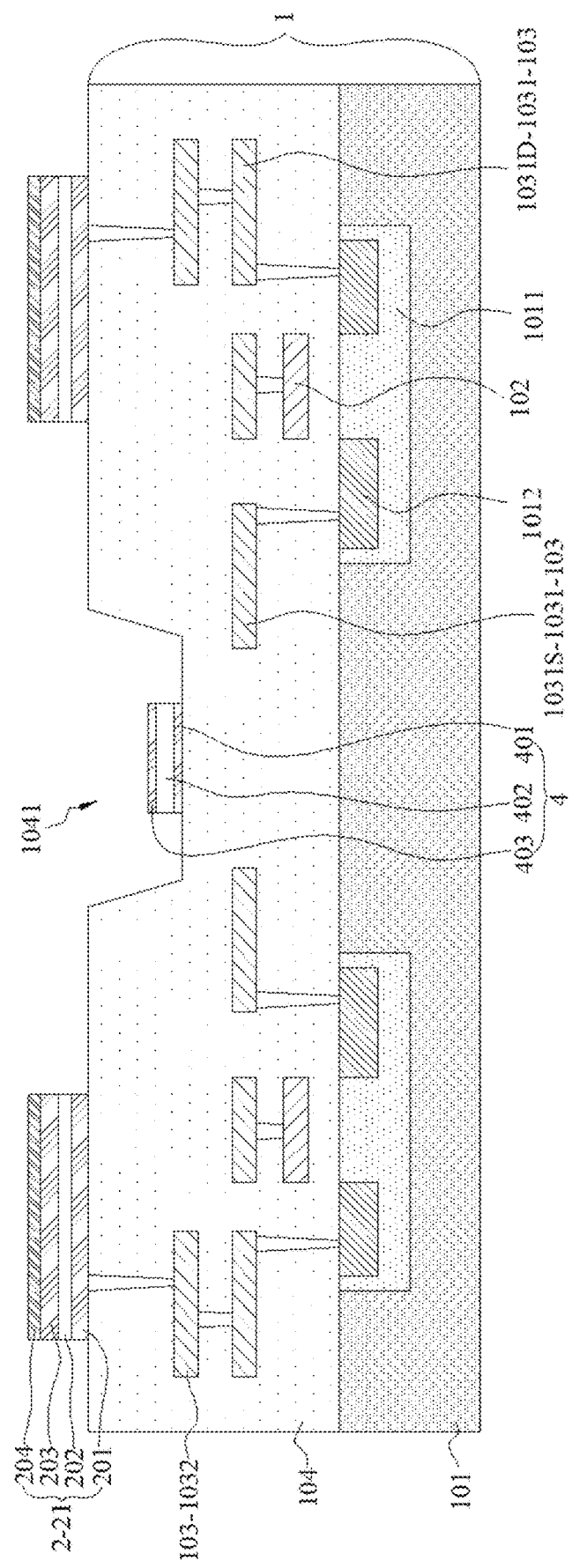
FIG. 26 is a schematic structural diagram of a step S230 in another embodiment of a manufacturing method for a display panel of the present disclosure.
Figure 27:
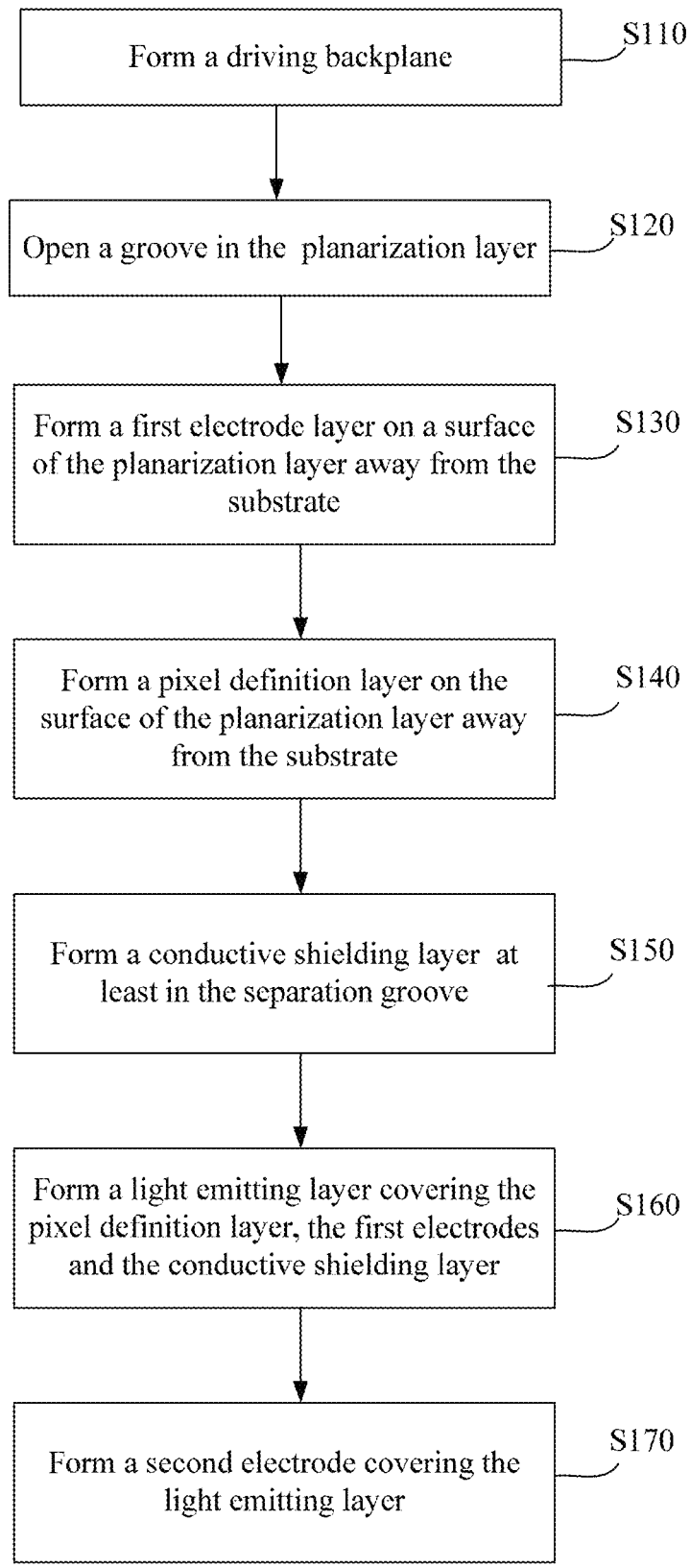
FIG. 27 and FIG. 28 are schematic flowcharts of manufacturing methods for a display panel according to an embodiment of the present disclosure.
Figure 28:
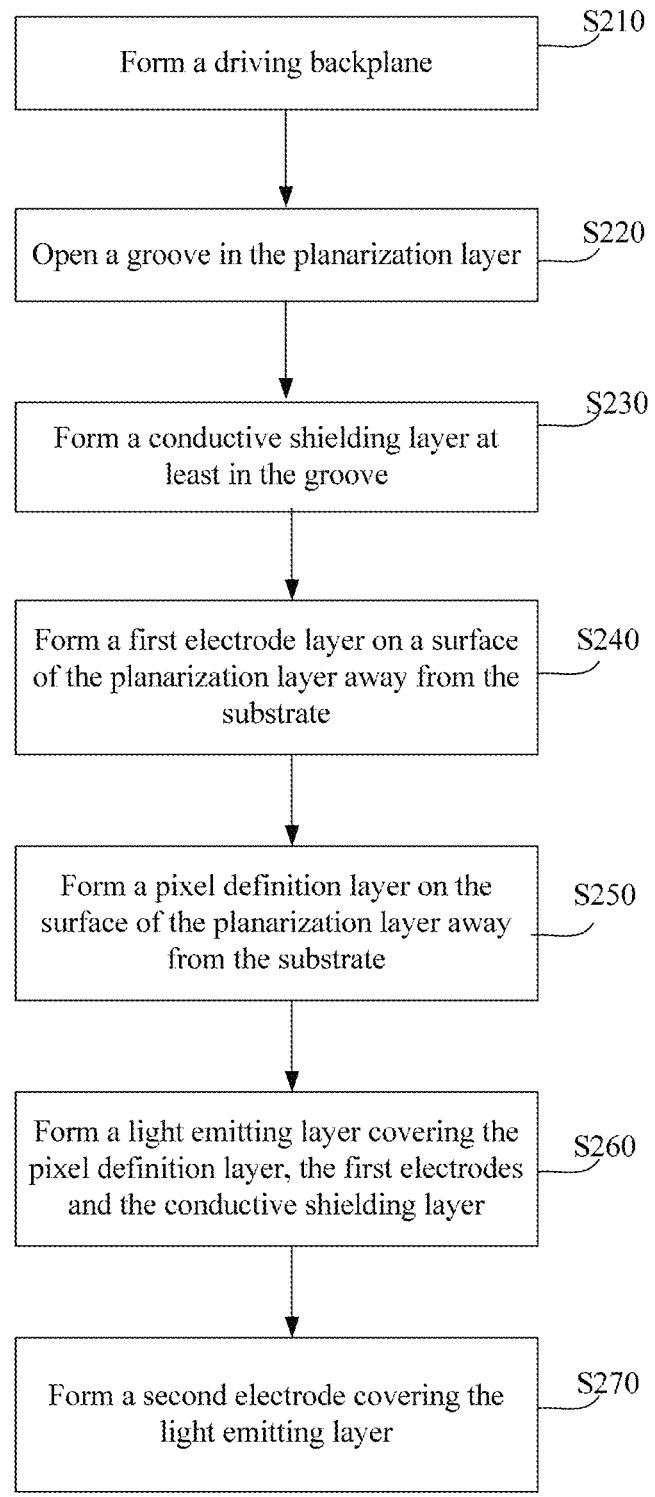

The present disclosure further provides a manufacturing method for a display panel, and the display panel may be the display panel of any of the above-mentioned embodiments. As shown in FIGS. 8, 26 and 28, the manufacturing method may include steps S210-S270.

In the step S210, a driving backplane is formed, and the driving backplane includes a substrate, at least one wiring layer and a planarization layer, the wiring layer is disposed on a side of the substrate, and the wiring layer is covered by the planarization layer.

In the step S220, a groove is opened in the planarization layer, as shown in FIG. 26.

In the step S230, a conductive shielding layer is formed at least in the groove, as shown in FIG. 26.

In the step S240, a first electrode layer is formed on a surface of the planarization layer away from the substrate, the first electrode layer includes a plurality of first electrodes distributed at intervals, and an orthographic projection of the groove on the planarization layer is located outside the first electrodes.

In the step S250, a pixel definition layer exposing each first electrode and the conductive shielding layer is formed on the surface of the planarization layer away from the substrate, and a separation groove is formed by the pixel definition layer at the groove.

In the step S260, a light-emitting layer covering the pixel definition layer, the first electrodes and the conductive shielding layer is formed, and the light-emitting layer is recessed at the separation groove and is in direct contact with at least a partial area of the conductive shielding layer.

In the step S270, a second electrode covering the light-emitting layer is formed.

In addition, the manufacturing method of the present disclosure may further include step S280:

a color filter layer including a plurality of filter portions is formed on a side of the second electrode away from the driving backplane, and individual first electrodes are disposed opposite to individual filter portions in a direction perpendicular to the substrate, as shown in FIG. 8.

Specific details of the above manufacturing method have been described in detail in the above embodiments of the display panel, and reference may be made to the embodiments of the display panel, which will not be repeated here.

It should be noted that although various steps of the manufacturing method in the present disclosure are described in a particular order in the drawings, this is not required or implied that these steps must be performed in the particular order, or all the steps shown must be performed to achieve a desired result. Additionally or alternatively, certain steps may be omitted, multiple steps may be combined into one step for execution, and/or one step may be decomposed into multiple steps for execution, and so on.

The embodiments of the present disclosure further provide a display device, and the display device includes the display panel of any of the above-mentioned embodiments, and for a specific structure of the display panel, reference can be made to the embodiments of the display panel above, which will not be repeated here. The display device of the present disclosure may be an electronic device with an image display function, such as a mobile phone, a tablet computer, etc., which will not be listed one by one here.

Other embodiments of the present disclosure will be apparent to those skilled in the art from consideration of the specification and practice of the present disclosure disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
    a driving backplane, comprising a substrate, a wiring layer and a planarization layer, wherein the wiring layer is disposed on a side of the substrate, the wiring layer is covered by the planarization layer, and the planarization layer is provided with a groove;
    a first electrode layer, disposed on a surface of the planarization layer away from the substrate, and comprising a plurality of first electrodes distributed at intervals, wherein an orthographic projection of the groove on the planarization layer is located outside the first electrodes;
    a pixel definition layer, disposed on the surface of the planarization layer away from the substrate, wherein each first electrode is exposed by the pixel definition layer, and a separation groove is formed by the pixel definition layer at the groove;
    a conductive shielding layer, at least partially disposed in the groove and insulated from the first electrodes;
    a light-emitting layer, by which the pixel definition layer, the first electrodes and the conductive shielding layer are covered, wherein the light-emitting layer is recessed at the separation groove and is in direct contact with at least a partial area of the conductive shielding layer; and
    a second electrode, by which the light-emitting layer is covered.

2. The display panel according to claim 1, wherein a bottom surface of the groove is covered by the pixel definition layer, an area of the pixel definition layer by which the bottom surface of the groove is covered is a bottom surface of the separation groove, and the conductive shielding layer is at least partially stacked on the bottom surface of the separation groove.

3. The display panel according to claim 1, wherein the conductive shielding layer is disposed on a bottom surface of the groove, and at least a partial area of the conductive shielding layer is exposed by the pixel definition layer.

4. The display panel according to claim 1, wherein the conductive shielding layer is coupled to the second electrode.

5. The display panel according to claim 4, wherein the separation groove comprises at least one annular groove body, and one groove body is surrounded outside one first electrode;
the conductive shielding layer comprises at least one shielding ring, and one shielding ring is disposed in one groove body; and
any groove body and a shielding ring in the groove body are surrounded outside a same one first electrode.

6. The display panel according to claim 5, wherein the number of the groove bodies is the same as the number of the first electrodes, and one groove body is surrounded outside each first electrode, one shielding ring is disposed in each groove body.

7. The display panel according to claim 6, wherein individual groove bodies are in communication with each other to form an integral structure, and individual shielding rings are coupled into an integral structure.

8. The display panel according to claim 7, wherein each shielding ring is coupled to the second electrode.

9. The display panel according to claim 8, wherein the driving backplane comprises a pixel area and a peripheral area located outside the pixel area, orthographic projections of the first electrodes on the driving backplane are located within the pixel area, and an orthographic projection of an edge of the second electrode on the driving backplane is located within the peripheral area;
the conductive shielding layer further comprises a connection body coupled to a shielding ring, and an orthographic projection of the connection body on the driving backplane is extended from the pixel area to the peripheral area; and
the second electrode is coupled to the shielding ring through the connection body.

10. The display panel according to claim 5, wherein at least a part of the at least one shielding ring is coupled to the second electrode through a first via hole by which the light-emitting layer is penetrated, and an orthographic projection of at least one first via hole on the planarization layer is located between two adjacent first electrodes.

11. The display panel according to claim 5, wherein the at least one wiring layer comprises a connection portion coupled to the second electrode, and the at least one shielding ring is coupled to the second electrode through a second via hole in the planarization layer.

12. The display panel according to claim 5, wherein a surface of the at least one shielding ring away from the substrate is provided with a ridge that is extended along a circumferential direction.

13. The display panel according to claim 12, wherein the surface of the at least one shielding ring away from the substrate is provided with a depression that is extended along the circumferential direction, and the ridge and the depression are distributed along a radial direction of the at least one shielding ring.

14. The display panel according to claim 1, wherein a thickness of the conductive shielding layer is less than a depth of the groove.

15. The display panel according to claim 5, wherein a ratio of a width of the at least one shielding ring to a width of the groove is smaller than 4:5.

16. The display panel according to claim 2, wherein a thickness of the conductive shielding layer is greater than a thickness of the pixel definition layer.

17. The display panel according to claim 1, wherein the conductive shielding layer is located on a side of the first electrodes close to the substrate.

18. The display panel according to claim 2, wherein the bottom surface of the separation groove comprises a middle area and an edge area located outside the middle area, an orthographic projection of the conductive shielding layer on the bottom surface of the separation groove is coincided with the middle area, and at least a partial area of the edge area is located on a side of the middle area away from the substrate.

19. A manufacturing method for a display panel, comprising:
forming a driving backplane, wherein the driving backplane comprises a substrate, at least one wiring layer and a planarization layer, the wiring layer is disposed on a side of the substrate, and the wiring layer is covered by the planarization layer;
opening a groove in the planarization layer;
forming a first electrode layer on a surface of the planarization layer away from the substrate, wherein the first electrode layer comprises a plurality of first electrodes distributed at intervals, and an orthographic projection of the groove on the planarization layer is located outside the first electrodes;
forming a pixel definition layer on the surface of the planarization layer away from the substrate, wherein each first electrode is exposed by the pixel definition layer, and a separation groove is formed by the pixel definition layer at the groove;
forming a conductive shielding layer at least in the separation groove;
forming a light-emitting layer by which the pixel definition layer, the first electrodes and the conductive shielding layer are covered, wherein the light-emitting layer is recessed at the separation groove and is in direct contact with at least a partial area of the conductive shielding layer; and
forming a second electrode by which the light-emitting layer is covered.

20. A manufacturing method for a display panel, comprising:
forming a driving backplane, wherein the driving backplane comprises a substrate, at least one wiring layer and a planarization layer, wherein the wiring layer is disposed on a side of the substrate, and the wiring layer is covered by the planarization layer;
opening a groove in the planarization layer;
forming a conductive shielding layer at least in the groove;
forming a first electrode layer on a surface of the planarization layer away from the substrate, wherein the first electrode layer comprises a plurality of first electrodes distributed at intervals, and an orthographic projection of the groove on the planarization layer is located outside the first electrodes;

forming a pixel definition layer on the surface of the planarization layer away from the substrate, wherein each first electrode and the conductive shielding layer are exposed by the pixel definition layer, and a separation groove is formed by the pixel definition layer at the groove;

forming a light-emitting layer by which the pixel definition layer, the first electrodes and the conductive shielding layer are covered, wherein the light-emitting layer is recessed at the separation groove and is in direct contact with at least a partial area of the conductive shielding layer; and forming a second electrode by which the light-emitting layer is covered.

* * * * *

UNITED STATES PATENT AND TRADEMARK OFFICE
CERTIFICATE OF CORRECTION

| | | |
|---|---|---|
| PATENT NO. | : 12,342,696 B2 | Page 1 of 1 |
| APPLICATION NO. | : 17/915955 | |
| DATED | : June 24, 2025 | |
| INVENTOR(S) | : Yang et al. | |

It is certified that error appears in the above-identified patent and that said Letters Patent is hereby corrected as shown below:

On the Title Page

The first Assignee(s) in item (73):
YANNAN INVENSIGHT OPTOELECTRONICS TECHNOLOGY CO., LTD., Yannan (CN)
Should read:
---YUNNAN INVENSIGHT OPTOELECTRONICS TECHNOLOGY CO., LTD., Yunnan (CN)---

Signed and Sealed this
Thirtieth Day of September, 2025

John A. Squires
*Director of the United States Patent and Trademark Office*